United States Patent
Higuchi et al.

(10) Patent No.: US 7,258,742 B2
(45) Date of Patent: *Aug. 21, 2007

(54) METHOD OF MANUFACTURING POTASSIUM NIOBATE SINGLE CRYSTAL THIN FILM, SURFACE ACOUSTIC WAVE ELEMENT, FREQUENCY FILTER, FREQUENCY OSCILLATOR, ELECTRONIC CIRCUIT, AND ELECTRONIC APPARATUS

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation (JP)

( * ) Notice: Subject to any disclaimer, the term of this patent is extended or adjusted under 35 U.S.C. 154(b) by 375 days.

This patent is subject to a terminal disclaimer.

(21) Appl. No.: 10/916,208

(22) Filed: Aug. 11, 2004

(65) Prior Publication Data
US 2005/0076829 A1    Apr. 14, 2005

Related U.S. Application Data

(63) Continuation-in-part of application No. 10/808,250, filed on Mar. 24, 2004.

(30) Foreign Application Priority Data
Mar. 26, 2003    (JP)    ............................. 2003-085761

(51) Int. Cl.
C30B 25/02    (2006.01)
(52) U.S. Cl. .............................. 117/86; 117/89; 117/94; 117/95; 117/104; 117/105
(58) Field of Classification Search .................. 117/86, 117/89, 94, 95, 104, 105
See application file for complete search history.

(56) References Cited

U.S. PATENT DOCUMENTS 5,824,419 A    10/1998    Kawai et al.

(Continued)

FOREIGN PATENT DOCUMENTS

JP    10-065488    3/1998

(Continued)

OTHER PUBLICATIONS

Hiryoyuki Odagawa et al, "Superhigh Electromechanical Coupling and Zero-Temperature Characteristics of KNbO3 and Wide Band Filter Applications", Jpn. J. Appl. Phys. vol. 37 (1998) pp. 2929-2932.

(Continued)

*Primary Examiner*—Robert Kunemund
(74) *Attorney, Agent, or Firm*—Harness, Dickey & Pierce, P.L.C.

(57) ABSTRACT

A method of manufacturing $KNbO_3$ single crystal thin film having single-phase high quality and excellent morphology on each of single crystal substrates. A surface acoustic wave element, frequency filter, frequency oscillator, electronics circuit, and electronic device employ the thin film manufactured by the method, and have high $k^2$, and are wideband, reduced in size and economical in power consumption. A plasma plume containing K, Nb, and O in the range $0.5 \leq x \leq x_E$ is supplied to a substrate, where x is a mole ratio of niobium (Nb) to potassium (K) in $K_xNb_{1-x}O_y$, and $x_E$ is a mole composition ratio at the eutectic point for $KNbO_3$ and $3K_2O \cdot Nb_2O_5$ under a predetermined oxygen partial pressure. Maintaining the temperature $T_s$ of the substrate in the range $T_E \leq T_s \leq T_m$ where $T_E$ represents the temperature at the eutectic point and $T_m$ represents a complete melting temperature, the KNbO3 single crystal is precipitated from the $K_xNb_{1-x}O_y$ deposited on the substrate.

17 Claims, 14 Drawing Sheets

U.S. PATENT DOCUMENTS

| | | | |
|---|---|---|---|
| 6,203,860 B1 | 3/2001 | Kawai et al. | |
| 2005/0200235 A1* | 9/2005 | Higuchi et al. | 310/313 R |
| 2006/0198599 A1* | 9/2006 | Higuchi et al. | 385/147 |

FOREIGN PATENT DOCUMENTS

| | | |
|---|---|---|
| JP | 2001-068964 | 3/2001 |
| JP | 2001-185988 | 7/2001 |
| JP | 2001-196892 | 7/2001 |

OTHER PUBLICATIONS

K. Yamanouchi et al, "Theoretical and experimental study of super-high electromechanical coupling surface acoustic wave propagation in KNbO3 single crystal", Electronics Letters, vol. 33, No. 3, (1997) pp. 193-194.

Yoshihiko Shibata et al, "Epitaxial Growth of LiNbO3 Films on Sapphire Substrates by Excimer Laser Ablation Method and Their Surface Acoustic Wave Properties", Jpn. J. Appl. Phys. vol. 32 (1993) pp. L745-L747.

Jun Koike et al, "1.5 GHz Low-Loss Surface Acoustic Wave Filter Using ZnO/Sapphire Substrate", Jpn. J. Appl. Phys. vol. 32 (1993) pp. 2337-2340.

H.-M Christen et al, "The growth and properties of epitaxial KNbO3 thin films and KNbO3/KTaO3 superlattices", Appl. Phys. Lett 68 (11) (1996) pp. 1488-1490.

Arnold Reisman et al, "Phase Equilibria in the System K2CO3-Nb2O5 by the Method of Differential Thermal Analysis", Watson Laboratories of International Business Machines, vol. 77, (1955) pp. 2115-2119.

Wu Xing et al, "Progress in KNbO3 Crystal Growth", Journal of Crystal Growth 78 (1986) pp. 431-437.

K.S. Yun et al, "Vapor-liquid-solid tri-phase pulsed-laser epitaxy of RBa2Cu3O7-y single-crystal films", Applied Physics Letters, vol. 80, No. 1 (2002) pp. 61-63.

Ryuichi Komatsu, et al., "Growth and Characterization of Potassium Niobate (DNbO$_3$) Crystal from An Aqueous Solution", Jpn. J. Appl. Phys., vol. 40 (2001) pp. 5657-5659.

* cited by examiner

METHOD OF MANUFACTURING POTASSIUM NIOBATE SINGLE CRYSTAL THIN FILM, SURFACE ACOUSTIC WAVE ELEMENT, FREQUENCY FILTER, FREQUENCY OSCILLATOR, ELECTRONIC CIRCUIT, AND ELECTRONIC APPARATUS

PRIORITY CLAIM

This application is a continuation-in-part application based on U.S. patent application Ser. No. 10/808,250 filed on Mar. 24, 2004, and priority is claimed on Japanese Patent Application No. 2003-085761 filed on Mar. 26, 2003, the contents of which are incorporated herein by reference.

BACKGROUND OF THE INVENTION

1. Field of the Invention

The present invention relates to a method of manufacturing potassium niobate single crystal thin films, and to surface acoustic wave elements, frequency filters, frequency oscillators, electronic circuits, and electronic apparatuses, each having the potassium niobate single crystal thin film.

2. Description of Related Art

There has been a remarkable expansion in the demand for surface acoustic wave elements with rapid developments in telecommunications centered on mobile communication, which is typified by mobile telephones. Some trends in the development of surface acoustic wave elements include size reduction, increasing efficiency, and increasingly higher frequencies, as in mobile telephones. In order to attain these, a larger electromechanical coupling coefficient ($k^2$ hereinbelow) and a higher surface acoustic wave propagation velocity are necessary. For example, when used as a high frequency filter, a high $k^2$ is desirable in order to obtain a small loss and a wide bandwidth. In order to make the resonance frequency higher, a material having a higher acoustic velocity is desirable in view of the limits of the design rules for the pitch of inter-digital transducers (IDT hereinbelow). Furthermore, in order to stabilize the characteristics of the temperature range in which surface acoustic wave elements are used, the center frequency temperature coefficient (TCF) must be small.

Conventionally, surface acoustic wave elements generally have a structure in which an IDT is formed on a single crystal piezoelectric body. Representative piezoelectric single crystals are those of quartz, lithium niobate ($LiNbO_3$ hereinbelow), or lithium tantalate ($LiTaO_3$ hereinbelow). For example, in an RF filter requiring a broad band and low loss in the pass band, $LiNbO_3$, which has a large $k^2$, is used. In contrast, in an IF filter requiring stable temperature characteristics even in a narrow band, quartz, which has a small TCF, is used. Furthermore, $LiTaO_3$ plays an intermediate role because its $k^2$ and TCF are each between those of $LiNbO_3$ and quartz. However, even for $LiTaO_3$, which has the highest $k^2$, the $k^2$ is about 20%.

Recently, a cut angle that exhibits a large $k^2$ value has been discovered in potassium niobate ($KNbO_3$ hereinbelow) single crystal (a=0.5695 nm, b=0.5721 nm, c=0.3973 nm; below, the orthorhombic crystal is represented by these indices). As reported in Electron. Lett. Vol. 33 (1997) 193, it can be predicted by calculation that a 0° Y-cut X-propagation (hereinbelow 0° Y-X) $KNbO_3$ single crystal plate shows an extremely high value of $k^2$=53%. Furthermore, as reported in Jpn. J. Appl. Phys. Vol. 37 (1998) 2929, it has been experimentally confirmed that a 0° Y-X $KNbO_3$ single crystal plate demonstrates a high value of $k^2$ (about 50%), and it is reported that the oscillation frequency of the filter using the Y-X $KNbO_3$ single crystal plate rotated from 45° to 75° demonstrates zero temperature properties at room temperature. Published Japanese Patent Application No. Hei 10-65488 discloses that the single crystal plates are used as a surface acoustic wave substrate.

In surface acoustic wave elements that use a piezoelectric single crystal substrate, characteristics such as the $k^2$, temperature coefficient, and sound velocity are values intrinsic to the material, and are determined by the cut angle and the propagation direction. A 0° Y-X $KNbO_3$ single crystal substrate has a superior $k^2$, but the zero temperature properties like those of the Y-X $KNbO_3$ single crystal substrate rotated from 45° to 75° are not exhibited at room temperature. In addition, the propagation speed is low in comparison to that of strontium titanate ($SrTiO_3$ hereinbelow) and calcium titanate ($CaTiO_3$ hereinbelow), which are also perovskite-type oxides. Thus, when only a $KNbO_3$ single crystal substrate is used, the sound velocity, high $k^2$, and zero temperature properties cannot all be satisfied.

Thus, a piezoelectric thin film is laminated on some type of substrate, film thickness is controlled, and it is thereby anticipated that the sound velocity, $k^2$, and temperature characteristics will be improved. Examples include a zinc oxide (ZnO hereinbelow) thin film formed on a sapphire substrate, as reported in Jpn. J. Appl. Phys. Vol 32 (1993) 2337, or a $LiNbO_3$ thin film formed on a sapphire substrate, as reported in Jpn. J. Appl. Phys. Vol. 32 (1993) L745. Therefore, for $KNbO_3$ as well, it is anticipated that all properties will be improved by depositing a thin film onto a substrate.

It is preferable that the piezoelectric thin film be oriented in an optimal direction in order to exhibit its $k^2$ and temperature characteristics, and that it be a flat, compact epitaxial film in order to minimize as much as possible the loss that accompanies leaky wave propagation. A Y-X $KNbO_3$ thin film having a $k^2$ of about 50% corresponds to the pseudo-cubic crystal (100), and the 90° Y-X $KNbO_3$ thin film having a $k^2$ of 10% corresponds to the pseudo-cubic crystal (110). Therefore, for example, by using a $SrTiO_3$ (100) or (110) single crystal substrate, it is possible to obtain a Y-X $KNbO_3$ thin film having a $k^2$ of about 50% or a 90° Y-X $KNbO_3$ thin film having a $k^2$ of about 10%.

In manufacturing $KNbO_3$ thin films according to a typical method of manufacturing thin films, such as a conventional vapor deposition or sol-gel method, since the saturation vapor pressure of K is extremely high compared to that of Nb, K vaporizes easily in comparison to Nb, which biases the composition of the thin film manufactured towards excess Nb compared with the initial composition. In order to compensate for this alteration in composition, according to Appl. Phys. Lett, Vol. 68 (1996) 1488, a target made to have excess K is used.

However, as is clear from the phase diagram of the $K_2O$—$Nb_2O_5$ shown in FIG. 19 cited from J. Am. Chem. Soc. Vol. 77 (1955) 2117, on the side where the composition of the $KNbO_3$ has K in excess, $3K_2O.Nb_2O_5$ compound is present. Below the eutectic temperature of 845° C. for $KNbO_3$ and $3K_2O.Nb_2O_5$, both $KNbO_3$ and $3K_2O.Nb_2O_5$ coexist as a solid phase. On the side where the composition of the $KNbO_3$ has Nb in excess, $2K_2O.3Nb_2O_5$ compound is present. Below the melting point of 1039° C. of $KNbO_3$, both $KNbO_3$ and $2K_2O.3Nb_2O_5$ coexist in a solid phase. Therefore, in manufacturing by a vapor deposition method, when the initial material ablated by a laser beam has arrived at the substrate, if the composition ratio is not exactly K:Nb=50:50 and is shifted either to the K excess side or the Nb excess side, the thin film manufactured includes a different phase, and s single phase is not produced.

On the other hand, in the case of $KNbO_3$ bulk single crystal, according to J. Crystal Growth Vol. 78 (1986) 431, using a Top-Seeded Solution Growth (TSSG) method, a large single crystal can be obtained, by pulling up the single seed crystal from a liquid phase that has K in slight excess over K:Nb=50:50. In the $K_2O$—$Nb_2O_5$ two dimensional phase diagram of FIG. 19, this may be obtained by placing the starting material, having a composition ratio from $K_2O$:$Nb_2O_5$=50:50 to about $K_2O$:$Nb_2O_5$=65:35, into a coexistent region for the liquid phase and the $KNbO_3$ that exists in an area above the eutectic temperature of 845° C. for $KNbO_3$ and $3K_2O.Nb_2O_5$. That is, in FIG. 2, when the starting material having composition $C_1$ is cooled from the liquidus temperature $T_1$ to the crystal growth temperature $T_2$, the $KNbO_3$ is precipitated from the liquid phase and the liquid phase shifts to composition $C_2$ on the K excess side, in which $T_2$ serves as the liquidus temperature. Because the crystal growth rate in this case becomes higher as $C_1$-$C_2$ becomes larger, a composition having slightly more K than $KNbO_3$ and close to $KNbO_3$ is cooled down to a region in the vicinity of the eutectic temperature 845° C. of $KNbO_3$ and $3K_2O.Nb_2O_5$. The above behavior occurs in the air, and furthermore, occurs when a $KNbO_3$ bulk single crystal is grown from a high volume liquid phase.

On the other hand, there have been developed some processes for applying a crystal growth process, by which a single crystal is precipitated from a liquid phase in the air by a TSSG method, to a thin film manufacturing process by a evaporation deposition method at a reduced pressure. One of the processes is a tri-phase-epitaxy method, which stacks a gas phase material on a substrate that is held at a temperature in the solid-liquid coexisting region and precipitates the solid phase from the liquid phase. In a material of $NdBa_2Cu_3O_x$, after a single crystal thin film is grown, only the residue of the liquid phase $BaCuO_2.CuO$ are selectively etched to produce a single crystal thin film. This is explained in Appl. Phys. Lett. Vol. 80 (2002) 61.

However, the simple application of the tri-phase-epitaxy method to the manufacturing of a $KNbO_3$ single crystal thin film did not allow selective etching of the residue of the liquid phase $3K_2O.Nb_2O_5$ after a single crystal thin film was grown. Accordingly, since the liquid phase remained on the surface of the single crystal, a thin film having an excellent surface morphology could not be obtained.

There was a need in this situation for this invention to be made. The invention provides a method of manufacturing $KNbO_3$ single crystal thin film having an excellent surface morphology and a high quality single phase. In addition, using the thin film produced by the method, the invention provides a surface acoustic wave element that has high $k^2$, and is broadband advantageous in downsizing and saving power, a frequency filter, a frequency oscillator, an electronic circuit, and an electronic device.

SUMMARY OF THE INVENTION

The invention solves the following problems. A method of manufacturing potassium niobate single crystal thin film in accordance with the invention employs a vapor deposition method. The method includes the steps of supplying a material in a gas phase to a substrate so that a value of x is in a range $0.5 \leq x \leq x_E$ immediately after deposition of the material on the substrate, where the $x_E$ is a mole composition ratio at a eutectic point E for $KNbO_3$ and $3K_2O.Nb_2O_5$ under a predetermined oxygen partial pressure, and the x is a mole ratio of niobium (Nb) to potassium (K) in $K_xNb_{1-x}O_y$; precipitating potassium niobate single crystal while maintaining a temperature $T_s$ of the substrate in a range $T_E \leq T_s \leq T_m$, where $T_E$ is a temperature at the eutectic point, and $T_m$ is a complete melting temperature at the oxygen partial pressure and at the value of x in the range; and evaporating a liquid phase portion from the $K_xNb_{1-x}O_y$ where a solid phase portion and a liquid phase portion coexist. Advantageously, according to the method, the steps of evaporating and precipitating are repeated to continuously grow the potassium niobate single crystal thin film. According to the method, after the potassium niobate single crystal is precipitated from the $K_xNb_{1-x}O_y$ where a solid phase portion and a liquid phase portion deposited on the substrate coexist, the remainder of liquid having a shear in the composition is evaporated, which produces a single-layer potassium niobate single crystal having the reduced shear. Therefore, the potassium niobate single crystal thin film having excellent surface morphology can be obtained, which in turn enables a surface acoustic wave element having an excellent $k^2$ to be manufactured.

Preferably, the substrate includes an axis on a surface thereof that is oriented in a vertical direction and in an in-plane direction to the surface, and the single crystal is grown epitaxially on the substrate. According to the method, the potassium niobate single crystal thin film can be obtained that has a uniform orientation over the entire thin film with the substrate as a seed crystal. Therefore, using the potassium niobate single crystal thin film, a surface acoustic wave element having an excellent $k^2$ can be manufactured.

Advantageously, the substrate has a larger coefficient of thermal expansion than that of potassium niobate, and has a perovskite-type pseudo-cubic unit cell that is oriented in an in-plane (100) direction on an entire surface of the substrate. Moreover, the substrate is a strontium titanate (100) single crystal substrate. According to the method, the potassium niobate single crystal is precipitated in orthorhombic (110) orientation on the substrate. In addition, using the strontium titanate (100) single crystal substrate, which is a perovskite-type oxide single crystal substrate in a wide use, a potassium niobate single crystal thin film having good surface morphology can be obtained. An excellent surface acoustic wave element having a maximum value of about 30% for $k^2$ can be manufactured.

Advantageously, the substrate has a smaller coefficient of thermal expansion than that of potassium niobate, and has a perovskite-type pseudo-cubic unit cell that is oriented in an in-plane (100) direction on an entire surface of the substrate. Moreover, the substrate includes a silicon single crystal substrate and a buffer layer grown epitaxially thereon. According to the method, the potassium niobate single crystal grown epitaxially on the substrate is precipitated in orthorhombic (110) orientation. Using the potassium niobate single crystal thin film produced on the silicon single crystal substrate that is an inexpensive single crystal substrate, an excellent surface acoustic wave element having a maximum value of about 50% for $k^2$ can be manufactured.

Advantageously, the buffer layer includes a first buffer layer of a NaCl-type oxide and a second buffer layer of a simple perovskite-type oxide grown epitaxially thereon. In addition, the buffer layer includes a first buffer layer of a fluorite-type oxide, and a second buffer layer of a laminated perovskite-type oxide grown epitaxially on the first buffer layer and a simple perovskite-type oxide grown epitaxially on the laminated perovskite-type oxide. According to the method, since between the silicon single crystal and the potassium niobate single crystal there is formed a buffer layer suitable for the two crystals, the potassium niobate single crystal can be made even on the silicon single crystal substrate that is an inexpensive single crystal substrate. Using the potassium niobate single crystal thin film, an excellent surface acoustic wave element having a value $k^2$ closer to a theoretical value of about 50% can be manufactured.

Preferably, the substrate includes a body that is composed of one of quartz, crystal, $SiO_2$-covered silicon, and diamond-covered silicon, and a buffer layer formed thereon, and wherein the buffer layer contains a first buffer layer grown in in-plane orientation independently of crystal orientation of the substrate and a second buffer layer of an oxide grown epitaxially on the first buffer layer, the first and second buffer layers being manufactured by a vapor deposition method accompanying ion beam radiation. According to the method, the high-quality potassium niobate single crystal thin film can be manufactured even on a substrate made of a material such as quartz, crystal, $SiO_2$-covered silicon, or diamond-covered silicon that is inexpensive and appropriate for a surface acoustic wave element. By the use of the potassium niobate single crystal thin film, an excellent surface acoustic wave element having a maximum value of 50% for $k^2$ can be manufactured.

Preferably, the first buffer layer is composed of a NaCl-type oxide, and the second buffer layer is composed of a simple perovskite-type oxide. In addition, the first buffer layer is composed of a fluorite-type oxide, and the second buffer layer is composed of a laminated perovskite-type oxide and a simple perovskite-type oxide grown epitaxially on the laminated perovskite-type oxide. According to the method, the high-quality potassium niobate single crystal thin film can be manufactured on a substrate made of an inexpensive material such as quartz, crystal, $SiO_2$-covered silicon, or and diamond-covered silicon. Making use of the potassium niobate single crystal thin film, an excellent surface acoustic wave element having a value closer to a theoretical maximum value of about 50% for $k^2$ can be manufactured.

A surface acoustic wave element in accordance with the invention includes a potassium niobate single crystal thin film produced by the manufacturing method of the invention previously mentioned. The potassium niobate single crystal thin film having a large $k^2$ enables reduction in size of the surface acoustic wave element.

A frequency filter in accordance with the invention includes a surface acoustic wave element of the invention previously mentioned. A frequency oscillator in accordance with the invention includes a surface acoustic wave element of the invention previously mentioned. The frequency filter and the frequency oscillator are small and realize a filter of wide band.

An electronic circuit in accordance with the invention includes a frequency oscillator of the invention previously mentioned. The frequency oscillator has a filter of wide band characteristics, is reduced in size, and saves power. An electronic apparatus in accordance with the invention includes at least one of a frequency filter, a frequency oscillator, and an electronic circuit of the invention previously mentioned. The electronic apparatus provides a reduction in size power-saving, and wideband system.

DETAILED DESCRIPTION OF THE INVENTION

Figure 1A:
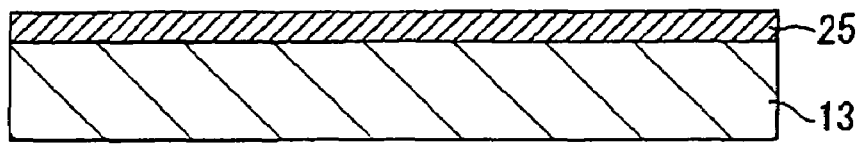
FIGS. 1A to 1D are cross-sectional views of a $KNbO_3$ thin film in a first embodiment.

Referring to FIGS. 1 to 6, a first embodiment in accordance with the invention will be discussed. FIGS. 1A to 1D are cross-sectional views of a $KNbO_3$ thin film in the first embodiment. The $KNbO_3$ single crystal thin film 10 in the embodiment, as shown in FIG. 1D, includes a substrate 11 and a $KNbO_3$ single crystal layer 12 grown epitaxially thereon in orthorhombic (001) orientation or orthorhombic (110) orientation. The substrate 11 contains a $SrTiO_3$ single crystal substrate 13, which has an crystal axis in (100) orientation in the direction perpendicular to, and in (001) orientation in the in-plane of, the surface thereof, and an initial layer 14 grown epitaxially on the $SrTiO_3$ single crystal substrate 13, which has at least one of K, Nb, Sr, Ti, and O. The $SrTiO_3$ single crystal substrate 13 has a coefficient of thermal expansion $11.1 \times 10^{-6}$ ($K^{-1}$) which is smaller than a coefficient of thermal expansion $14.1 \times 10^{-6}$ ($K^{-1}$) for a c-axis of the $KNbO_3$ single crystal layer 12, but is larger than coefficients of thermal expansion $5.0 \times 10^{-6}$ ($K^{-1}$) for an a-axis and $0.5 \times 10^{-6}$ ($K^{-1}$) for a b-axis. The initial layer 14, which is a boundary layer between $SrTiO_3$ and $KNbO_3$, is not limited with respect to structure and composition, but should be epitaxially grown on the $SrTiO_3$ single crystal substrate 13.

Figure 2:
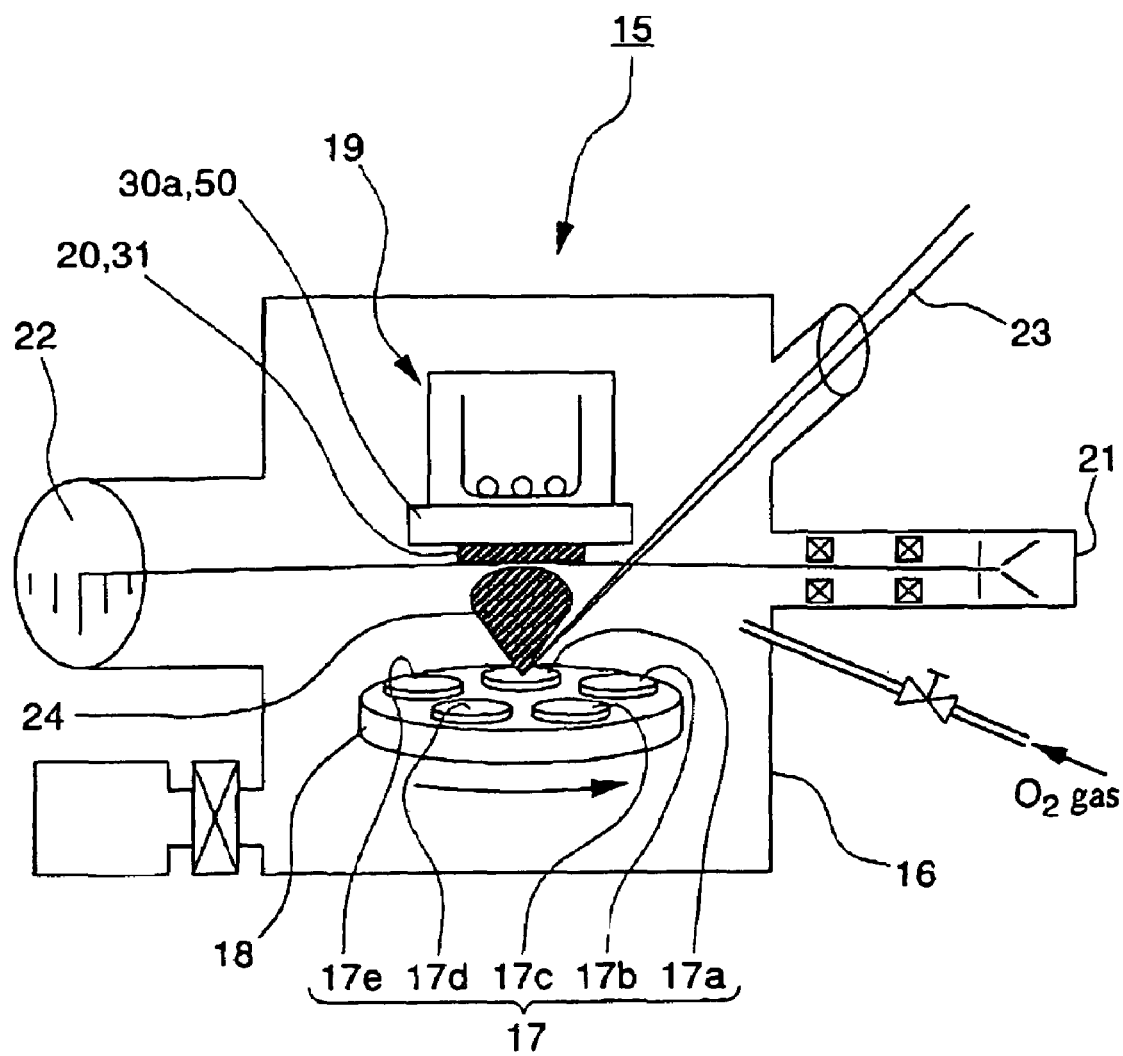
FIG. 2 is a perspective view of a deposition apparatus for the first embodiment.

FIG. 2 is a perspective view of a deposition apparatus 15 for the first embodiment. The KNbO$_3$ single crystal layer 12 is manufactured by a vapor deposition using ion beam radiation. A thin film in the embodiment is formed by a pulsed laser deposition (PLD) method. An apparatus 15 used for forming the film, as shown in FIG. 2, includes a process chamber 16 in which pressure can be reduced, at least one workpiece 17 placed opposite to the SrTiO$_3$ single crystal substrate 13, a workpiece support unit 18 that supports and rotates the workpiece 17 thereon and enables the workpiece 17 to revolve on its own axis, and a holding unit 19 for holding the SrTiO$_3$ single crystal substrate 13. The deposition apparatus 15 contains a reflection high energy electron diffraction (RHEED) source 21 used for analyzing a thin film 20 in a RHEED method, and an RHEED screen 22 for detecting beams reflected by the thin film 20 that are emitted by the RHEED source 21 to the thin film 20 deposited on the SrTiO$_3$ single crystal substrate 13.

The PLD method, which is a film forming method, will be described as follows: While a thin film is being formed, an ArF or a KrF excimer laser beam 23 is applied in a pulse mode to the workpiece 17 rotating on its own axis, and the inside of the process chamber 16 contains oxygen atmosphere at extremely low pressure, for example, 1/1000 atmospheric pressure. The application of the laser beam brings a part of the workpiece 17 into the plasma plume (plasma or molecular state) 24, which is flowed to the SrTiO$_3$ single crystal substrate 13 to deposit the thin film 20.

The manufacturing method of KNbO$_3$ single crystal thin film 10 of the embodiment in accordance with the invention will be explained below. When a temperature and a mole composition ratio at a eutectic point E for KNbO$_3$ and 3K$_2$O.Nb$_2$O$_5$ at a predetermined oxygen partial pressure are defined by T$_E$ and x$_E$, respectively (x represents a mole composition ratio for potassium (K) and niobium (Nb) when expressed by K$_x$Nb$_{1-x}$O$_y$), the plasma plume 24, which is a material for a gas phase state where the composition x of the liquid phase state immediately after depositing on the substrate 11 is in the range $0.5 \leq x \leq x_E$, is provided on the substrate 11. When a complete melting temperature at the partial oxygen pressure and the x is defined by T$_m$, keeping the temperature of the substrate in the range $T_E \leq T_s \leq T_m$, the method includes the steps of vaporizing the residue of K$_x$Nb$_{1-x}$O$_y$ deposited on the substrate 11 from the plasma plume 24, and precipitating the KNbO$_3$ single crystal on the substrate 11 from K$_x$Nb$_{1-x}$O$_y$. The manufacturing method will be explained.

Prior to the evaporation step, there is another step by which K$_x$Nb$_{1-x}$O$_y$ is supplied to and deposited on the SrTiO$_3$ single crystal substrate 13, which is described first. The SrTiO$_3$ single crystal substrate 13 is immersed in an organic solvent and is degreased and cleaned by an ultrasonic cleaning apparatus. The organic solvent can be, for example, a mixed liquid of ethyl alcohol and acetone at a ratio of 1:1, but is not limited to this example.

Figure 3A:
FIGS. 3A to 3D are photographs for the RHEED patterns observed in the first embodiment.

The initial layer 14 is made on the degreased and cleaned SrTiO$_3$ single crystal substrate 13. After loading the SrTiO$_3$ single crystal substrate 13 on the holding unit 19, the SrTiO$_3$ single crystal substrate 13 is introduced into the process chamber 16, a vacuum of $1.33 \times 10^{-6}$ Pa ($1 \times 10^{-8}$ Torr) is produced. Next, oxygen is introduced to produce an oxygen partial pressure of 1.33 Pa ($1 \times 10^{-2}$ Torr), which is followed by heating to 50° C. at a rate of 20° C./min using an infrared lamp (not shown). During the heating, the RHEED pattern from the SrTiO$_3$ <010> direction contains a diffraction pattern having the streaks as shown in FIG. 3A. The rate of temperature increase, substrate temperature, and pressure are not limited to the values shown above.

After the pressure has become constant, workpiece 17a of K$_{0.6}$Nb$_{0.4}$O$_y$ is placed to be opposite to the SrTiO$_3$ single crystal substrate 13 with a distance of more than 30 mm and less than 50 mm therebetween, where a mole ratio x for potassium (K) and niobium (Nb) expressed by K$_x$Nb$_{1-x}$O$_y$ is 0.6, which is in the range $0.5 \leq x \leq x_E$. When the substrate temperature is more than 500° C. but less than 850° C., and oxygen partial pressure at the deposition is more than $1.33 \times 10^{-1}$ Pa ($1 \times 10^{-3}$ Torr) but less than $1.33 \times 10^1$ Pa ($1 \times 10^{-1}$ Torr), excimer laser beam 23 is irradiated on the surface of the workpiece 17a, having an energy concentration between 2 J/cm$^2$ and 3 J/cm$^2$ and a frequency below 1 Hz.

Pulsed KrF excimer laser beam 23, having an energy concentration of 2.5 J/cm$^2$, a frequency of 10 Hz, and a pulse width of 10 ns, is applied to the workpiece 17a. On the surface of the workpiece 17a is produced the plasma plume 24 of K, Nb, and O. The plasma plume 24 is emitted for two minutes to the SrTiO$_3$ single crystal substrate 13 placed 40 mm away from the workpiece 17a, at a substrate temperature of 50° C. and an oxygen partial pressure of 1.33 Pa ($1 \times 10^{-2}$ Torr) to deposit the K$_{0.6}$Nb$_{0.4}$O$_y$ layer 25 epitaxially at a thickness of 2 nm, as shown in FIG. 1A. As long as the initial layer 14 is grown epitaxially, the conditions are not limited to those above.

Figure 1B:
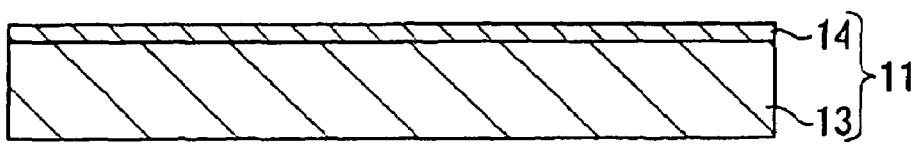
Figure 3B:
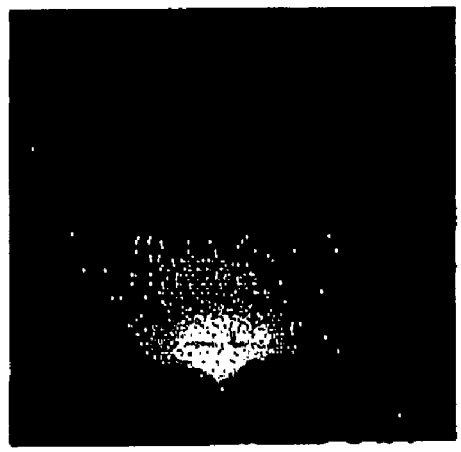
Figure 3C:
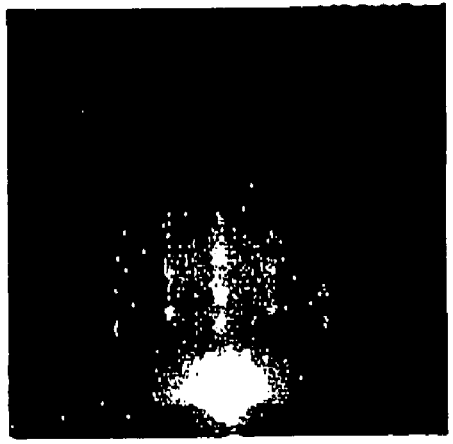
Figure 3D:
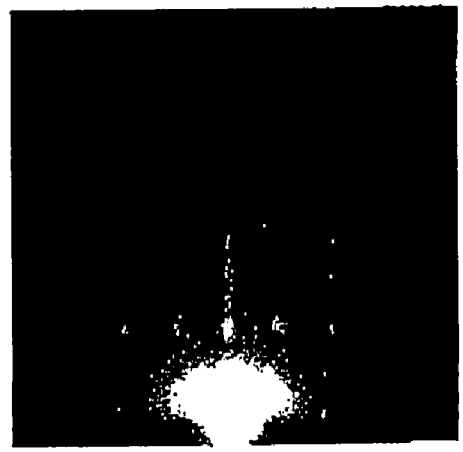
Figure 4:
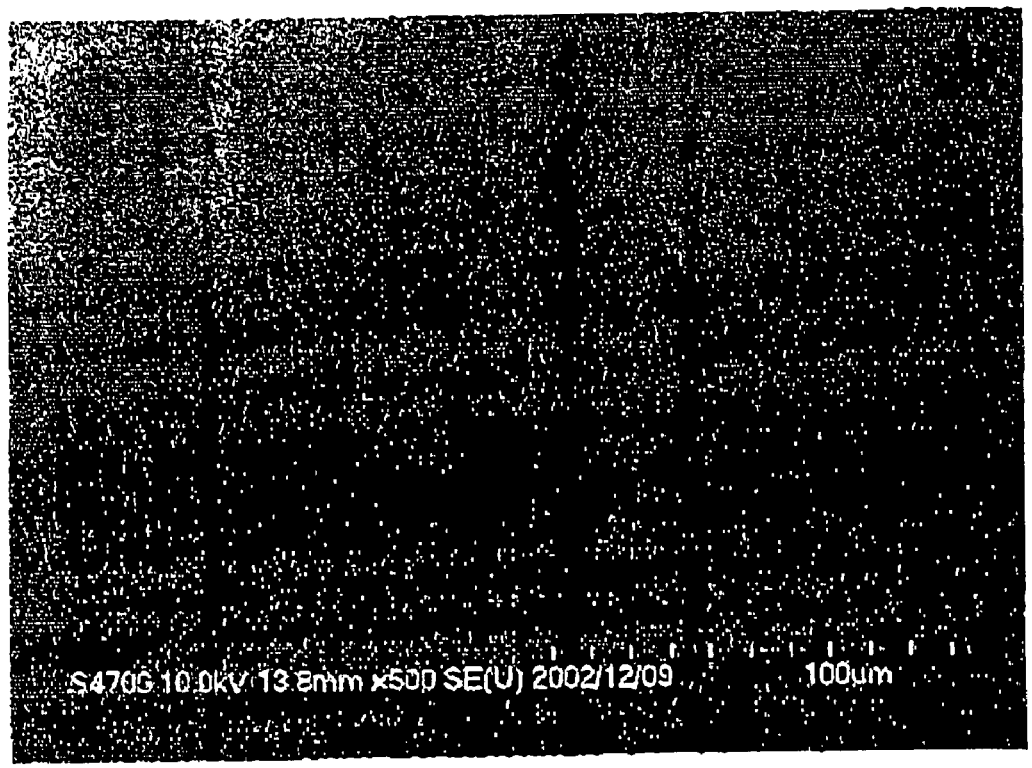
FIG. 4 is a photograph by a scanning electron microscope for a surface of the thin film obtained in the first embodiment.

Since the eutectic point E for KNbO$_3$ and 3K$_2$O.Nb$_2$O$_5$ at the above oxygen partial pressure is between 750° C. and 800° C., the K$_{0.6}$Nb$_{0.4}$O$_y$ layer 25 is not grown epitxially at this stage. The RHEED pattern from the SrTiO$_3$ <010> direction contains no diffraction pattern as shown in FIG. 3B. Therefore, heat is added to the complete melting temperature of 850° C. at the above oxygen partial pressure and composition, using a infrared lamp (not shown) at a rate of increase of 20° C./min. Then, at 750° C.-800° C., the spot pattern as the RHEED pattern shown in FIG. 3C appears. Above 800° C., with respect to K$_{0.6}$Nb$_{0.4}$O$_y$, most of the liquid phase is evaporated from a coexistent condition of the solid liquid phase of KNbO$_3$, and the remaining portion of KNbO$_3$ reacts with the SrTiO$_3$ single crystal substrate 13. Thus, as shown in FIG. 1B, the initial layer 14 is grown epitaxially that constitutes one of K, Nb, Sr, Ti, and O.

The evaporating step and precipitating step will be explained below. When the substrate temperature is more than 750° C. but less than 850° C., and the oxygen partial pressure at the deposition is more than $1.33 \times 10^{-1}$ Pa ($1 \times 10^{-3}$ Torr) and less than $1.33 \times 10^1$ Pa ($1 \times 10^{-1}$ Torr), an excimer laser beam 23 is emitted on the surface of the workpiece 17a of K$_{0.6}$Nb$_{0.4}$O$_y$, having an energy concentration between 2 J/cm$^2$ and 3 J/cm$^2$ and a frequency below 5 Hz.

Figure 1C:
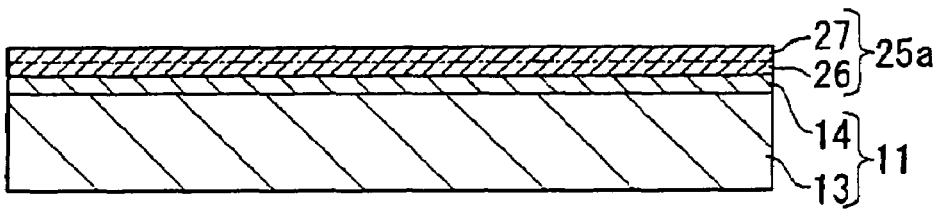

The pulsed KrF excimer laser beam 23, having an energy concentration of 2.5 J/cm$^2$, a frequency 10 Hz, and a pulse width of 10 ns, are applied to the workpiece 17a. On the surface of the workpiece 17a is produced the plasma plume 24 of K, Nb, and O. The plasma plume 24 is emitted for 60 minutes to the SrTiO$_3$ single crystal substrate 13 placed 40 mm away from the workpiece 17a, at a substrate temperature of 800° C. and an oxygen partial pressure of 1.33 Pa ($1 \times 10^{-2}$ Torr) to deposit the K$_{0.6}$Nb$_{0.4}$O$_y$ layer 25 at a thickness of 200 nm, as shown in FIG. 1C. A solid phase portion 26 and a liquid phase portion 27 coexist in the K$_{0.6}$Nb$_{0.4}$O$_y$ layer 25 immediately after the deposition.

Figure 1D:
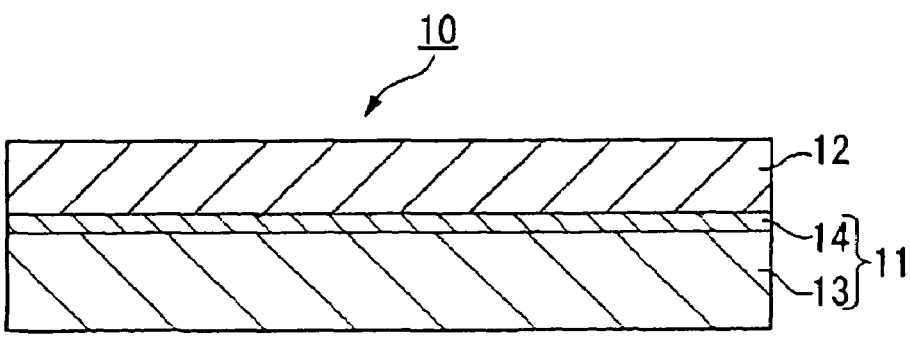

Since the KrF excimer laser beam 23 is pulsed, they provide the plasma plume 24 to the SrTiO$_3$ single crystal substrate 13 intermittently. In providing the pulses, the KNbO$_3$ single crystal layer 12 is precipitated from the solid phase portion 26, with the initial layer 14 as a nucleus for crystal growth, as shown in FIG. 1D. As a result, the remainder of the liquid phase portion 27 evaporates. Thus, the $KNbO_3$ single crystal layer 12 is grown epitaxially by 200 nm. When observing the $KNbO_3$ single crystal layer 12 obtained, the diffraction pattern shown in FIG. 3D and smooth surface condition shown in FIG. 4 can be confirmed.

Figure 5:
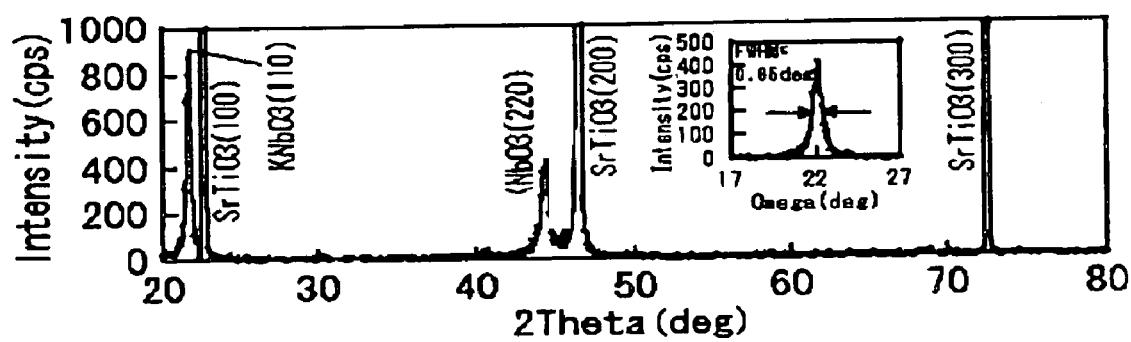
FIG. 5 is an X ray diffraction pattern of a surface of the thin film obtained in the first embodiment.

When $KNbO_3$ and $SrTiO_3$ are expressed by the orthorhombic and cubic indices, respectively, from this result and the x-ray diffraction result shown in FIG. 5, it is confirmed that a $KNbO_3$ single crystal film 10 is obtained that has the following orientation relationship: $KNbO_3$ (110)/$SrTiO_3$ (100) in the direction perpendicular to the film surface and $KNbO_3$ <001>//$SrTiO_3$<001> in the direction parallel to the film surface. $KNbO_3$ is in orthorhombic (110) orientation, because the c axis, which has the largest coefficient of thermal expansion of the three axes—a, b, and c, is oriented to the inside of the surface of the substrate, in response to a compressive force from the $SrTiO_3$ single crystal substrate 13 having a relatively large coefficient of thermal expansion in the process of reducing the temperature. As long as the plasma plume 24 can sufficiently reach the $SrTiO_3$ single crystal substrate 13, and a balance between the deposition rate and the volume of evaporation of the liquid phase 27 is kept so that the liquid phase 27 cannot be present, each of the conditions is not limited to the above. Moreover, in the described precipitating process, the value of x for the workpiece 17a is set at x=0.6 to give $K_{0.6}Nb_{0.4}O_y$. If the x is in the range $0.5 \leq x \leq x_E$ under the oxygen partial pressure, the same $KNbO_3$ single crystal thin film can be obtained.

Figure 6:
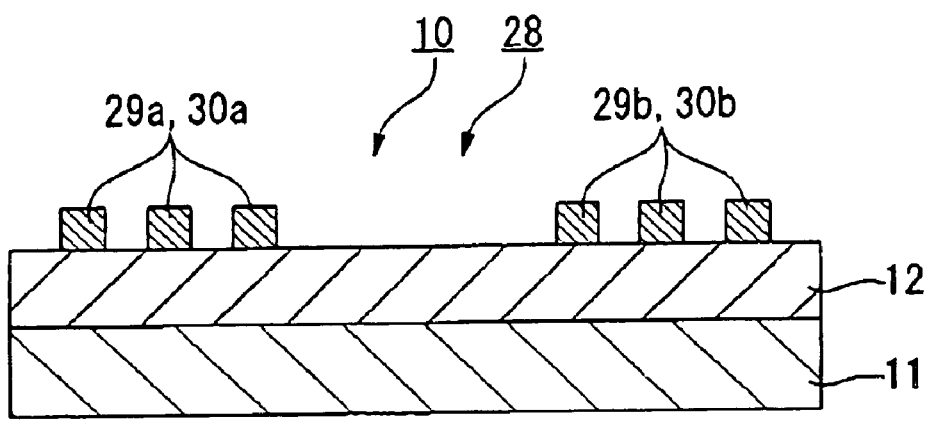
FIG. 6 is a cross-sectional view of the surface acoustic wave element in the first embodiment.

FIG. 6 is a cross-sectional view of a surface acoustic wave element 28 in the first embodiment. The surface acoustic wave element 26 will be explained below. The surface acoustic wave element 28, as shown in FIG. 6, includes the $KNbO_3$ single crystal thin film 10 explained above. A method of making the surface acoustic wave element 26 will be explained below. First, by vacuum vaporization using aluminum (Al) metal, a pair of aluminum electrodes 29a and 29b is deposited on the $KNbO_3$ single crystal thin film 10 under conditions that the degree of vacuum is $6.65 \times 10^{-5}$ Pa ($5 \times 10^{-7}$ Torr) and the substrate temperature is 45° C. The temperature of the substrate and the degree of vacuum are not limited to these. Next, a series of processes—resist coating, exposure, dry etching, patterning process by removing resist—is performed on the aluminum electrodes 29a and 29b to form a pair of IDTs 30a and 30b. In this way, the surface acoustic wave element 28 is manufactured.

With respect to the surface acoustic wave element 28 manufactured, a sound speed, which is obtained from delay time $V_{open}$ of a train of surface acoustic waves traveling between 30a and 30b of the IDT, is 4000 m/s. The value $k^2$, obtained from the difference between delay time $V_{open}$ and delay time $V_{short}$ of a train of surface acoustic waves when the space between 30a and 30b of the IDT is covered with metal thin film, is 25%. When the $KNbO_3$ single crystal thin film is not carried out, even if the sound speed is 4000 m/s, the value of $k^2$ obtained is about 10%, which is large enough. Even if niobium acid tantalic acid potassium sodium is used in place of potassium niobate as the workpiece 17a, a solid solution thin film of $K_{1-x}Na_xNb_{1-y}Ta_yO_3$ ($0 \leq x \leq 1$, $0 \leq y \leq 1$) can be obtained as well.

According to the method of manufacturing the $KNbO_3$ single crystal thin film, a single phase $KNbO_3$ single crystal with a shift of composition suppressed can be precipitated in orthorhombic (110) orientation on the $SrTiO_3$ (100) single crystal substrate 13 of a perovskite oxide single crystal substrate in a wide use. The $KNbO_3$ single crystal thin film 10, which is excellent in surface morphology, can be obtained. By the use of the $KNbO_3$ single crystal thin film 10, a surface acoustic wave element 28 having excellent $k^2$ can be manufactured.

The second embodiment in accordance with the invention will be explained referring to FIGS. 7-10. The elements in the first embodiment are assigned the same reference numbers and will not be described in the explanation below. The second embodiment differs from the first embodiment in that with respect to the $KNbO_3$ single crystal thin film 10 of the first embodiment, the $KNbO_3$ single crystal is epitaxially grown on the substrate 11 including the $SrTiO_3$ single crystal substrate 13 and the initial layer 14, while in the second embodiment, the $KNbO_3$ single crystal is epitaxially grown on the substrate 31, through the initial layer 14, including the silicon single crystal substrate 31a and the buffer layer 32 epitaxially grown thereon, thus producing the $KNbO_3$ single crystal thin film 33.

Figure 7:
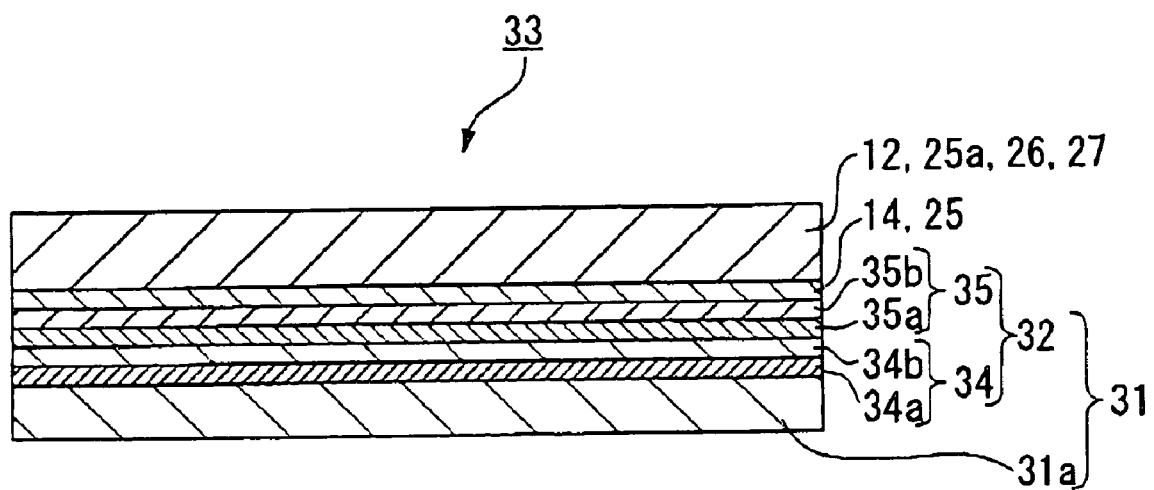
FIG. 7 is a cross-sectional view of the $KNbO_3$ thin film in a second embodiment.

The silicon single crystal substrate 31a has a coefficient of thermal expansion of $3.0 \times 10^{-6}$ ($K^{-1}$), which is larger than a coefficient of thermal expansion of $0.5 \times 10^{-6}$ ($K^{-1}$) for a b-axis of the $KNbO_3$ single crystal layer 12, but is smaller than coefficients of thermal expansion $5.0 \times 10^{-6}$ ($K^{-1}$) for an a-axis and $14.1 \times 10^{-6}$ ($K^{-1}$) for a c-axis. The substrate surface is coated by a naturally oxidized film. FIG. 7 is a cross-sectional view of $KNbO_3$ thin film in the second embodiment. The buffer layer 32, as shown in FIG. 7, includes a first buffer layer 34 and a second buffer layer 35 epitaxially grown on the first buffer layer 34. The first buffer layer 34 contains a first buffer layer 34a having yttria-stabilized zirconia (YSZ) and a first buffer layer 34b having $CeO_2$ epitaxially grown on the first buffer layer 34a.

The first buffer layer 34a and the first buffer layer 34b are composed of a metallic oxide, which may be a NaCl structure or fluorite structure. In particular, the following is preferable: MgO, CaO, SrO, or BaO that includes a metal which is more likely to combine with oxygen thermodynamically than Si, or at least one kind of solid solutions that include these, or YSZ, $CeO_2$, Zr $O_2$, or at least one kind of solid solution that includes these. In the embodiment, as the first buffer layer 34a, the YSZ is epitaxially grown in cubic (100) orientation, and as the first buffer layer 34b, the $CeO_2$ is epitaxially grown in cubic (100) orientation.

The second buffer layer 35 is made up of a second buffer layer 35a and a second buffer layer 35b. The second buffer layer 35a includes $YBa_2Cu_3O_x$, a laminated perovskite-type oxide, epitaxially grown in tetragonal or orthorhombic (100) orientation. The second buffer layer 35b contains, on the second buffer layer 35a, $SrTiO_3$, a simple perovskite-type oxide, epitaxially grown in cubic (100) orientation. The $KNbO_3$ single crystal layer 12 is composed of the $KNbO_3$ single crystal in orthorhombic (110) or (001) orientation grown epitaxially on the initial layer 14, which includes one of K, Nb, Ti, and O grown epitaxially on the second buffer layer 35. When the first buffer layer 34 is manufactured using a metallic oxide of NaCl structure such as MgO, the same effect can be brought about even if only $SrTiO_3$ as the second buffer layer 35 is epitaxially grown in cubic (100) orientation.

The method of manufacturing the $KNbO_3$ single crystal thin film 33 of the embodiment will be described. The embodiment, as the first embodiment, includes the evaporating process that evaporates the remaining liquid of $K_xNb_{1-x}O_y$ deposited on the substrate 31 from the plasma plume 24, and the precipitating process that precipitates a $KNbO_3$ single crystal on the substrate 31 from the $K_xNb_{1-x}O_y$. Each of the processes will be explained one by one below.

The Si single crystal substrate 31a is immersed in an organic solvent, and degreased and cleaned using an ultrasonic degreasing and cleaning apparatus. The organic solvent can be, for example, a mixed liquid of ethyl alcohol and acetone at a ratio of 1:1, but is not limited to this example. To leave a naturally oxidized film, there is no need for a process to remove the naturally oxidized film such as an RCA cleaning or hydrofluoric acid cleaning, which are typical cleaning methods for a conventional Si single crystal substrate.

Figure 8A:
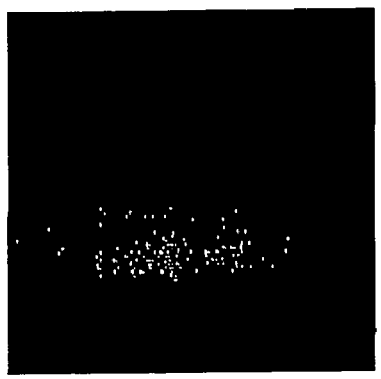
FIGS. 8A to 8F are photographs of the RHEED patterns observed in the second embodiment.
Figure 8B:
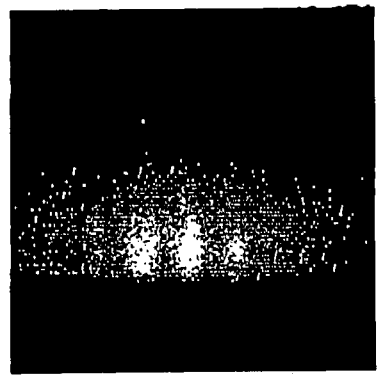
Figure 8C:
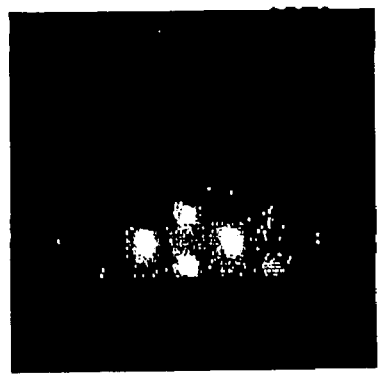
Figure 8D:
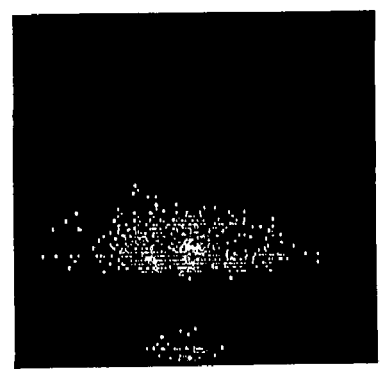
Figure 8E:
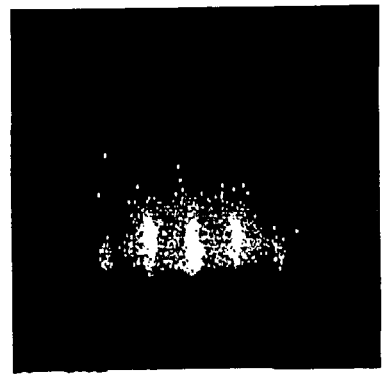
Figure 8F:
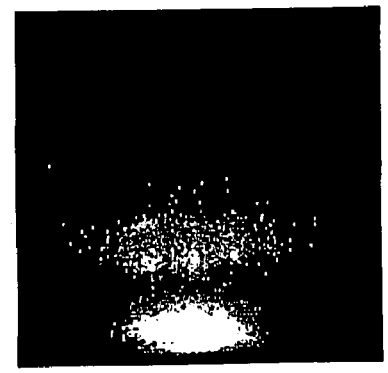

Manufacturing the buffer layer 32 will be explained by the film forming apparatus of FIG. 2 using the PLD method. First, the buffer layer 34a is formed on the Si single crystal substrate 31a. The degreased and cleaned Si single crystal substrate 31a is loaded on the holding unit 19, and then is brought into the process chamber 16, whose pressure is reduced to $1.33 \times 10^{-6}$ Pa ($1 \times 10^{-8}$ Torr) and whose temperature is raised to 700° C. at the rate of 10° C./min by infrared lamps (not shown). In the temperature range of more than 500° C., since part of the natural oxidization film is evaporated as SiO, the level of the vacuum is raised to $1.33 \times 10^{-4}$ Pa ($1 \times 10^{-6}$ Torr), but at 700° C. is below $6.65 \times 10^{-5}$ Pa ($5 \times 10^{-7}$ Torr), which is constant. So long as a new thermal oxidation film is not formed on the surface of the Si single crystal substrate 31a, the rate of temperature increase, substrate temperature, and pressure are not limited to these. As a diffraction pattern is not observed, as shown in FIG. 8A, in the RHEED pattern from the <011> direction, the surface of the Si single crystal substrate 31a remains covered by the naturally oxidized film.

When the pressure has become constant, the workpiece 17a having the YSZ is placed opposite to the Si single crystal substrate 31a, with a distance of more than 30 mm and less than 50 mm therebetween. On the condition that the substrate temperature is somewhere between 650 and 750° C., and the oxygen partial pressure at the time of deposition is somewhere between $1.33 \times 10^{-3}$ Pa ($1 \times 10^{-5}$ Torr) and $1.33 \times 10^{-2}$ Pa ($1 \times 10^{-4}$ Torr), the excimer laser beam 23, whose energy concentration is more than 2 J/cm$^2$ and less than 3 J/cm$^2$ and whose frequency is more than 5 Hz and less than 15 Hz, is emitted on the surface of the workpiece 17a. The conditions are not limited to the above ranges, as long as Y and Zr plasmas are selected to reach the substrate, and epitaxial growth can be carried out as the YSZ, removing a natural oxidization film on the substrate as SiO. However, subject to a condition or conditions, even if the YSZ first buffer layer 34a is formed, oxygen is supplied to the boundary of the Si single crystal substrate 31a and a new oxidization film may be formed. When ZrO$_2$ forms a solid solution as cubic, Y on the workpiece 17a may be replaced by one of the following elements: La, Ce, Pr, Nd, Pm, Sm, Eu, Gd, Tb, Dy, Ho, Er, Tm, Yb, Lu, Mg, Ca, Sr, and Ba.

The pulsed excimer laser beam 23, having an energy concentration of 2.5 J/cm$^2$, a frequency of 10 Hz, and a pulse width of 10 ns, is emitted to produce a plasma plume 24 including Y, Zr, and O on the surface of the workpiece 17a. The plasma plume 24 is directed, for ten minutes, toward the Si single crystal substrate 31a placed 40 mm away from the workpiece 17a, at a substrate temperature of 700° C. and an oxygen partial pressure of $6.65 \times 10^{-3}$ Pa ($5 \times 10^{-5}$ Torr), to grow the YSZ first buffer layer 34a epitaxially 5 nm, as shown in FIG. 7. The epitaxial growth can be confirmed by the fact that a streak diffraction pattern appears in the RHEED pattern from the Si <011> direction shown in FIG. 8B.

The forming of the first buffer layer 34b is explained below. The workpiece support unit 19 is rotated so that the workpiece 17b including CeO$_2$ may be placed in opposition to the Si single crystal substrate 31a. The pulsed KrF excimer laser beam 23 is irradiated on the surface of the workpiece 17b, as mentioned above. The irradiation conditions are the same as those of the YSZ. At this time, the conditions for the laser are set at an energy concentration of 2.5 J/cm$^2$, a frequency of 10 Hz, and a pulse width of 10 ns. Plasma plume 24 containing Ce and O is generated on the surface of the workpiece 17b. The plasma plume is emitted, for ten minutes, to the Si single crystal substrate 311a placed 40 mm away from the workpiece 17b, at a substrate temperature of 700° C. and oxygen partial pressure of $6.65 \times 10^{-3}$ Pa ($5 \times 10^{-5}$ Torr) to grow the CeO$_2$ first buffer layer 34b epitaxially to a thickness of 10 nm, as shown in FIG. 7. The epitaxial growth can be confirmed by the fact that a spot diffraction pattern appears in the RHEED pattern from the Si <011> direction shown in FIG. 8C. As long as CeO$_2$ is grown epitaxially, each of the conditions is not limited to the above. If CeO$_2$ constitutes a solid solution as cubic, the same effect can be obtained even when Pr or Zr is added.

Next, formation of the second buffer layer 35a will be described. The workpiece support unit 18 is rotated so that the workpiece 17c including YBa$_2$Cu$_3$O$_x$ may be placed opposite to the Si single crystal substrate 31a. The pulsed KrF excimer laser beam 23 is irradiated on the surface of the workpiece 17c, as mentioned above. The substrate temperature is somewhere between 550° C. and 650° C., and the oxygen partial pressure at the time of deposition is somewhere between $1.33 \times 10^{-1}$ Pa ($1 \times 10^{-3}$ Torr) and $1.33 \times 10^{1}$ Pa ($1 \times 10^{-1}$ Torr). Except for these conditions of the substrate temperature and the oxygen partial pressure, other conditions are the same as those of the YSZ. The conditions of the laser beam is that the energy concentration is 2.5 J/cm$^2$, the frequency is 10 Hz, and the pulse width is 10 ns. Plasma plume 24 containing Y. Ba, Cu, and O is generated on the surface of the workpiece 17c. The plasma plume 24 is directed, for two minutes, to the Si single crystal substrate 31a placed 40 mm away from the workpiece 17c, at a substrate temperature of 600° C. and oxygen partial pressure of 1.33 Pa ($1 \times 10^{-2}$ Torr) to grow the YBa$_2$Cu$_3$O$_x$ second buffer layer 35a epitaxially to a thickness of 2 nm, as shown in FIG. 7. The epitaxial growth can be confirmed by the fact that a streak diffraction pattern appears in the RHEED pattern from the Si <011> direction shown in FIG. 8D.

However, each of the conditions is not limited by the above so long as the plasma having Y. Ba, and Cu can reach the substrate at a ratio of 1:2:3 and the YBa$_2$Cu$_3$O$_x$ is grown epitaxially. In addition, instead of YBa$_2$Cu$_3$O$_x$, the same effects can be obtained by M$_2$RuO$_4$ (M represents one of Ca, Sr, and Ba), a solid solution of RE$_2$NiO$_4$ (RE represents one of La, Ce, Pr, Nd, Pm, Sm, Eu, Gd, Th, Dy, Ho, Er, Tm, Yb, Lu, and Y) and NiO, REBa$_2$Cu$_3$O$_x$ (RE represents one of La, Ce, Pr, Nd, Pm, Sm, Eu, Gd, Th, Dy, Ho, Er, Tm, Yb, and Lu), or (Bi, RE)$_4$Ti$_3$O$_{12}$ (RE represents one of La, Ce, Pr, Nd, Pm, Sm, Eu, Gd, Tb, Dy, Ho, Er, Tm, Yb, Lu, and Y).

The production of the second buffer layer 35b will be explained below. The workpiece support unit 18 is rotated so that the workpiece 17d including SrTiO$_3$ may be placed opposite to the Si single crystal substrate 31a. The pulsed KrF excimer laser beam 23 is irradiated to the surface of the workpiece 17d. The substrate temperature is somewhere between 550° C. and 650° C., and the oxygen partial pressure at the time of deposition is somewhere between $1.33 \times 10^{-1}$ Pa ($1 \times 10^{-3}$ Torr) and $1.33 \times 10^{1}$ Pa ($1 \times 10^{-1}$ Torr) except that other conditions are the same as those of the YSZ. The conditions at the laser beams are that the energy density is 2.5 J/cm$^2$, the frequency is 10 Hz, and the pulse width is 10 ns. The plasma plume 24 containing Sr, Ti, and O is generated on the surface of the workpiece 17d. The plasma plume 24 is irradiated, for 30 minutes, to the Si single crystal substrate 31a placed 40 mm away from the workpiece 17d, at a substrate temperature of 600° C. and oxygen partial pressure of 1.33 Pa ($1 \times 10^{-2}$ Torr) to grow the $SrTiO_3$ second buffer layer 35b epitaxially 100 nm, as shown in FIG. 7. The epitaxial growth can be confirmed by the fact that a spot diffraction pattern appears in the RHEED pattern from the Si <011> direction shown in FIG. 8E.

However, the conditions are not limited by the above, as long as the Sr and Ti plasma can reach the Si single crystal substrate 31a at a 1:1 ratio and the $SrTiO_3$ can be grown epitaxially. In addition, instead of $SrTiO_3$, the same effects can be obtained by $MTiO_3$ (M is one of Ca and Ba), $REAlO_3$ (RE is one of La, Ce, Pr, Nd, Pm, Sm, Eu, Gd, Tb, Dy, Ho, Er, Tm, Yb, Lu, and Y), $MAlO_3$ (M is one of Mg, Ca, Sr, and Ba), or $REGaO_3$ (RE is one of La, Ce, Pr, Nd, Pm, Sm, Eu, Gd, Tb, Dy, Ho, Er, Tm, Yb, Lu, and Y).

An initial layer 14 is formed on the buffer layer 32 made, using the same method as in the first embodiment. In the first embodiment, the initial layer 14 is obtained after the $K_{0.6}Nb_{0.4}O_y$ layer is first deposited at 500° C. and then raised to 800° C., while in this embodiment, the same result can be obtained even by depositing the $K_{0.6}Nb_{0.4}O_y$ layer at 800° C. from the beginning. In this embodiment, pulsed KrF excimer laser beam 23, which has energy concentration of 2.5 J/cm², a frequency of 10 Hz, and a pulse length of 10 ns, impinge on the workpiece 17e. On the surface of the workpiece 17e, plasma plume 24 is generated having K, Nb and O that can be a material for gas phase state. The plasma plume 24 is irradiated, for 5 minutes, to the Si single crystal substrate 31a placed 40 mm away from the workpiece 17e, at a substrate temperature of 800° C. and oxygen partial pressure of 1.33 Pa ($1 \times 10^{-2}$ Torr) to deposit the $K_{0.6}Nb_{0.4}O_y$ layer 25 by to a thickness of 5 nm, as shown in FIG. 7. The conditions are not limited to the above, so long as the plasma plume 24 can sufficiently reach the Si single crystal substrate 31a and the initial layer 14 is epitaxially grown.

The next procedure is, as in the first embodiment, the evaporating process and the precipitating process. In this embodiment, pulsed KrF excimer laser beam 23, which have energy concentration of 2.5 J/cm², a frequency of 10 Hz, and a pulse length of 10 ns, impinge on the workpiece 17e. On the surface of the workpiece 17e, the plasma plume 24 is generated having K, Nb and O. The plasma plume 24 is emitted, for 360 minutes, to the Si single crystal substrate 31a placed 40 mm away from the workpiece 17e, at a substrate temperature of 800° C. and oxygen partial pressure of 1.33 Pa ($1 \times 10^{-2}$ Torr) to deposit the $K_{0.6}Nb_{0.4}O_y$ layer 25a to a thickness of 200 nm, as shown in FIG. 7. While the pulsed KrF excimer laser beam 23 is being supplied to the $K_{0.6}Nb_{0.4}O_y$ layer 25a right after being deposited, as in the first embodiment, the $KNbO_3$ single crystal layer 12 from the solid phase 26 is precipitated with the initial layer 14 as a nucleus for the crystal growth, and the remaining liquid phase portion 27 is evaporated. Thus, the $KNbO_3$ single crystal layer 12 is grown epitaxially to a thickness of 200 run. The epitaxial growth can be confirmed by the fact that a spot diffraction pattern appears in the RHEED pattern from the Si <011> direction shown in FIG. 8F.

Figure 9:
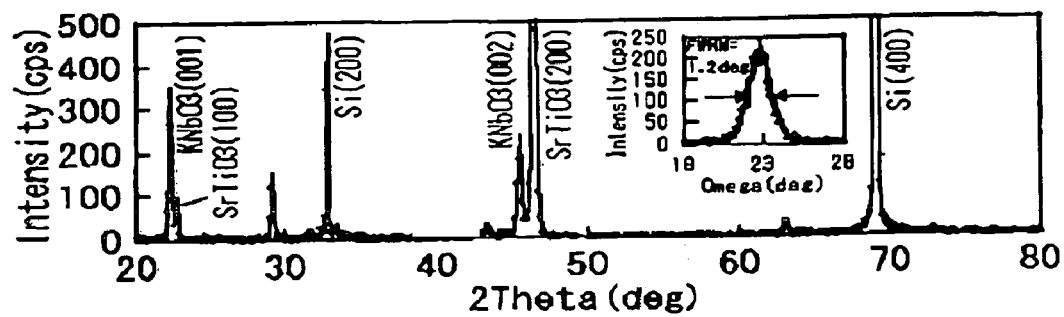
FIG. 9 is an X ray diffraction pattern of a surface of the thin film obtained in the second embodiment.

FIG. 9 is an X ray diffraction pattern of a surface of the thin film obtained in the second embodiment. In combination with FIG. 9, if $KNbO_3$, $SrTiO_3$, $YBa_2Cu_3O_x$, $CeO_2$, YSZ, and Si are represented, respectively, by an index for an orthorhombic crystal, a cubic crystal, a tetragonal crystal, a cubic crystal, a cubic crystal, and a cubic crystal, it is confirmed that the $KNbO_3$ single crystal thin film 33 is obtained having the following orientation relationships: In a direction perpendicular to the film surface $KNbO_3$(001)/ $SrTiO_3$(100)/$YBa_2Cu_3O_x$(001)/$CeO_2$(100)/YSZ(100)/Si (100), and in a direction in-plane to the film surface $KNbO_3$<110>//$SrTiO_3$<010>//$YBa_2Cu_3O_x$<100>// $CeO_2$<011>//YSZ<011>//Si<011>. The reason why the $KNbO_3$ has an orthorhombic (001) orientation is that during the process of the decreasing temperature, tensile stress is applied from the Si single crystal substrate 31a having a small coefficient of thermal expansion, which causes the b axis having the smallest coefficient of thermal expansion of the three axes the a, b, and c axes to be oriented to the in-plane direction. The conditions are not limited to the above, so long as the plasma plume 24 can sufficiently reach the Si single crystal substrate 31a and a balance between the deposition speed and the evaporation volume of the liquid phase portion 27 can be maintained so that the liquid phase portion 27 does not remain. In the precipitating process above, although the workpiece 17e is set at $K_{0.6}N_{0.4}O_y$, for x=0.6, the same $KNbO_3$ single crystal thin film can be obtained when the value of x is maintained in the range $0.5 \leq x \leq x_E$ under the oxygen partial pressure.

Figure 10:
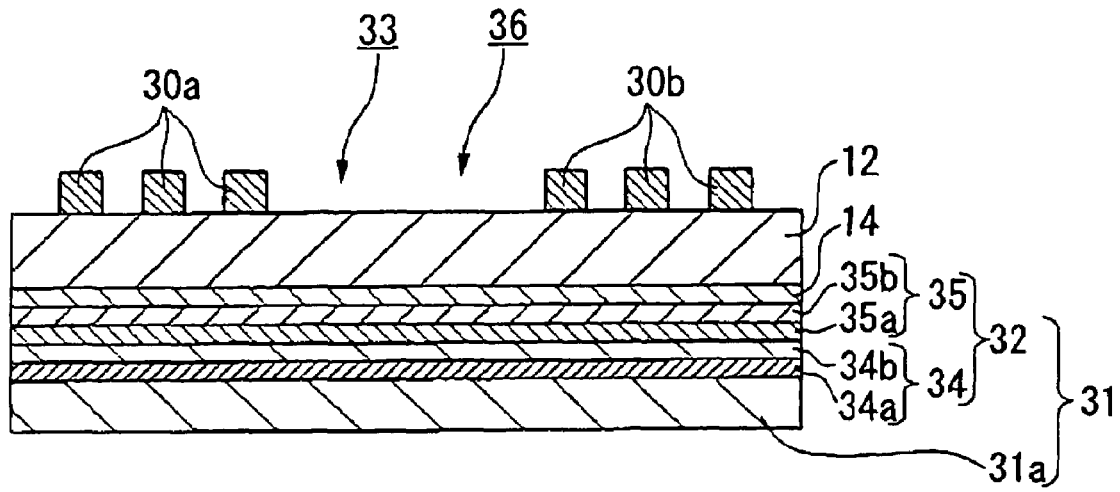
FIG. 10 is a cross-sectional view of the surface acoustic wave element in the second embodiment.

FIG. 10 is a cross-sectional view of the surface acoustic wave element in the second embodiment. A pair of IDTs 30a and 30b is formed on the $KNbO_3$ single crystal thin film 33 in the same way as is used for the first embodiment, which leads to manufacturing a surface acoustic wave element 36 shown in FIG. 10. In the surface acoustic wave element 36, the speed of sound was 5000 m/s, which was obtained from a delay time $V_{open}$ of the surface acoustic wave that traveled between the IDT 30a and the IDT 30b. The value of $k^2$ was 35%, which was acquired by a difference between the $V_{open}$ and a delay time $V_{short}$ of the surface acoustic wave that traveled between the IDT 30a and the IDT 30b when a space between the IDT 30a and the IDT 30b is covered with a metallic thin film. This value is higher than that of the surface acoustic wave element 28 obtained in the first embodiment. So long as potassium sodium niobate tantalate is used instead of potassium niobate as the workpiece 17a, a solid solution thin film of $K_{1-x}Na_xNb_{1-y}Ta_yO_3$ ($0 \leq x \leq 1$, $0 \leq y \leq 1$) can be acquired as well.

According to the manufacturing method of the $KNbO_3$ single crystal thin film, a buffer layer 32 is made on a Si single crystal substrate 31a, which is inexpensive, and a $KNbO_3$ single crystal is precipitated, which produces a $KNbO_3$ single crystal thin film 33. Since the $KNbO_3$ single crystal is precipitated in an orthorhombic (001) orientation, an excellent surface acoustic wave element 36 having a maximum value of about 50% for $k^2$ can be manufactured from the $KNbO_3$ single crystal thin film 33.

The third embodiment in accordance with the invention will be described referring to FIGS. 11 and 12. The elements in the above embodiments are given the same reference numbers and will not be described, in the explanation below. The third embodiment differs from the second embodiment in that in the second embodiment the buffer layer 32 is made on the Si single crystal substrate 31a and the $KNbO_3$ single crystal is grown epitaxially, while in the third embodiment on the crystal substrate (substrate itself) 40 is formed the buffer layer 32, on which the $KNbO_3$ single crystal is grown epitaxially.

Figure 11:
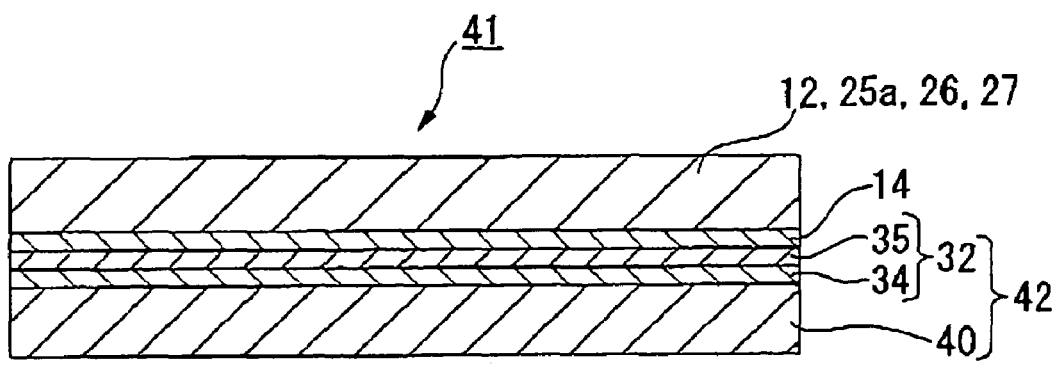
FIG. 11 is a cross-sectional view of the $KNbO_3$ thin film in a third embodiment.

FIG. 11 is a cross-sectional view of a $KNbO_3$ thin film in a third embodiment. A $KNbO_3$ single crystal thin film 41, as shown in FIG. 11, in the third embodiment includes a substrate 42 and a $KNbO_3$ single crystal layer 12 grown epitaxially thereon. The substrate 42 is composed of a crystal substrate 40 and a buffer layer 32 formed thereon. The material for the crystal substrate 40 may be any one of quartz except for crystal, silicon coated by $SiO_2$, or silicon coated by diamond. It may also be ceramics such as a polycrystal YSZ substrate, or amorphous material such as a glass substrate. In addition, it may be a perovskite-type oxide having a crystal structure on which epitaxial growth cannot be obtained. In the embodiment, a crystal having a wide use is used as a substrate for a surface acoustic wave element. The crystal substrate 40 has a coefficient of thermal expansion of $0.5 \times 10^{-6}$ ($K^{-1}$), while the b axis of the $KNbO_3$ single crystal layer 12 has a coefficient of thermal expansion of $0.5 \times 10^{-6}$ ($K^{-1}$), which is the same as that of the crystal substrate 40, but is smaller than that of $5.0 \times 10^{-6}$($K^{-1}$) for the a-axis or $14.1 \times 10^{-6}$ ($K^{-1}$) for the taxis.

The buffer layer 32 includes a first buffer layer 34 and a second buffer layer 35 that contains $SrTiO_3$, a simple perovskite-type oxide, grown epitaxially in cubic (100) orientation on the first buffer layer 34. The first buffer layer 34 is composed of metal oxide. As examples of this metal oxide, metal oxides having a NaCl structure or fluorite structure can be mentioned. The following is preferred: MgO, CaO, SrO, or BaO that includes metal tending to combine with oxygen more thermodynamically than Si, or at least one kind of solid solution that includes these; or YSZ, $CeO_2$, or $ZrO_2$, or at least one kind of solid solution that includes these. In addition, an in-plane orientation direction does not have to have any relationship with crystal orientation of the surface of the substrate.

The first buffer layer 34 of the embodiment is composed of MgO that is an NaCl-type oxide and is grown in cubic (100) and in-plane orientation. When a fluorite-type oxide such as YSZ or $YSZ/CeO_2$ is used as the first buffer layer 34, the following structure is grown epitaxially to be used. That is, as the second buffer layer 35, a metal oxide of layered perovskite structure such as $YBa_2Cu_3O_x$ is grown epitaxially in tetragonal or orthorhombic (001) orientation, on which $SrTiO_3$ is grown epitaxially in cubic (100) orientation. The $KNbO_3$ single crystal layer 12 is formed such that the $KNbO_3$ single crystal may be in orthorhombic (110) or (001) orientation.

The method of manufacturing the $KNbO_3$ single crystal thin film 41 described above will be explained below following each step. The present embodiment, as in the above-mentioned embodiment, also includes an evaporating process for evaporating the remaining liquid of $K_xNb_{1-x}O_y$ that is deposited on the substrate 42 from the plasma plume 24, and a precipitating process for precipitating the $KNbO_3$ single crystal from the $K_xNb_{1-x}O_y$ on the substrate 42. The manufacturing process will be discussed below. After the crystal substrate 40 is immersed in an organic solvent, an ultrasonic cleaning apparatus is used for degreasing and cleaning. As an organic solvent, for example, a mixed liquid of ethyl alcohol and acetone at a ratio of 1:1 can be used. However, the present invention is not limited to this mixed liquid.

Next, the buffer layer 32 is formed on the crystal substrate 40 by the film forming apparatus 15 shown in FIG. 2. The first buffer layer 32 is formed on the crystal substrate 40. The degreased and cleaned crystal substrate 40 is loaded on the holding unit 19, and then is brought into the process chamber 16, into which a mixed gas is introduced so that a pressure of $1.33 \times 10^{-2}$ Pa ($1 \times 10^{-4}$ Torr) may be established at a partial pressure ratio of Ar:Oxygen=100:1. The pressure condition is not limited to this.

When the pressure has become constant, the workpiece 17a having Mg or MgO is placed opposite to the crystal substrate 40, with a distance of more than 30 mm and less than 50 mm therebetween. On the condition that the pressure at the time of deposition is somewhere between $1.33 \times 10^{-3}$ Pa ($1 \times 10^{-5}$ Torr) and $1.33 \times 10^{-2}$ Pa ($1 \times 10^{-4}$ Torr), excimer laser beam whose energy concentration is more than 2 $J/cm^2$ and less than 3 $j/cm^2$ and whose frequency is more than 5 Hz and less than 15 Hz, is emitted on the surface of the workpiece 17a. So long as MgO is grown in in-plane orientation, each of the conditions is not limited to these.

The pulsed KrF excimer laser beam 23, having an energy concentration of 2.5 $J/cm^2$, a frequency of 10 Hz, and a pulse width of 10 ns, are applied to the Mg workpiece 17a. On the surface of the workpiece 17a is produced the plasma plume 24 of Mg. The plasma plume 24 is emitted, for ten minutes, to the crystal substrate 40 placed 40 mm away from the workpiece 17a, at a pressure of $1.33 \times 10^{-2}$ Pa ($1 \times 10^{-4}$ Torr), to grow the MgO first buffer layer 34 epitaxially to a thickness of 10 nm, as shown in FIG. 11.

Argon ion beams are impinging on the substrate at an angle of 45 degrees with a normal direction to the surface of the crystal substrate 40. As an ion beam source, a Kauffmann ion source is preferable. It is also preferable that an acceleration voltage for ion beams be about 200 eV, and that a current be about 10 mA. The substrate temperature is not controlled by a heater; however, impact by the argon ion beams raises the temperature of the substrate to 50-70° C.

After the MgO first buffer layer 34 is deposited, by the same method as is used in the second embodiment, the $SrTiO_3$ second buffer layer 35 is grown epitaxially by 100 nm to produce a substrate 42. An initial layer 14 is deposited at a thickness of 5 nm on the buffer layer 32 formed by the same method as that in the second embodiment. Likewise, the procedure goes to the evaporation process and the precipitating process in which the $K_{0.6}Nb_{0.4}O_y$ layer 25 is deposited to a thickness of 200 nm on the initial layer 14. While the pulsed KrF excimer laser beam 23 is being supplied to the $K_{0.6}Nb_{0.4}O_y$ layer 25a right after being deposited, as in the first embodiment, the KNbO3 single crystal layer 12 from the solid phase 26 is precipitated with the initial layer 14 as a nucleus for the crystal growth, and the remainder of the liquid phase portion 27 is evaporated. Thus, the $KNbO_3$ single crystal layer 12 is grown epitaxially to a thickness of 200 nm.

In this way, when $KNbO_3$ and $SrTiO_3$ are represented, respectively, by an orthorhombic and cubic crystal index, the $KNbO_3$ single crystal thin film 41 is produced that has the following orientation relationship: In the direction perpendicular to the film surface, $KNbO_3(001)/SrTiO_3(100)/MgO$ (100); and in the direction in-plane to the film surface, $KNbO_3<110>//SrTiO_3<010>//MgO<010>$. The reason why the $KNbO_3$ has an orthorhombic (001) orientation is that during the process of decreasing temperature, tensile stress is applied from the crystal substrate 40 having a small coefficient of thermal expansion, which causes the b-axis having the smallest coefficient of thermal expansion of the three axes the a, b, and c axes to be oriented in the in-plane direction. The conditions are not limited to the above, so long as the plasma plume 24 can sufficiently reach the crystal substrate 40 and a balance between the deposition speed and the evaporation volume of the liquid phase portion 27 can be maintained so that the liquid phase portion 27 does not remain. In the precipitating process above, although the workpiece 17a is set at $K_{0.6}N_{0.4}O_y$ for x=0.6, the same $KNbO_3$ single crystal thin film can be obtained when the value of x is held t in the range $0.5 \leq x \leq x_E$ under the oxygen partial pressure.

Figure 12:
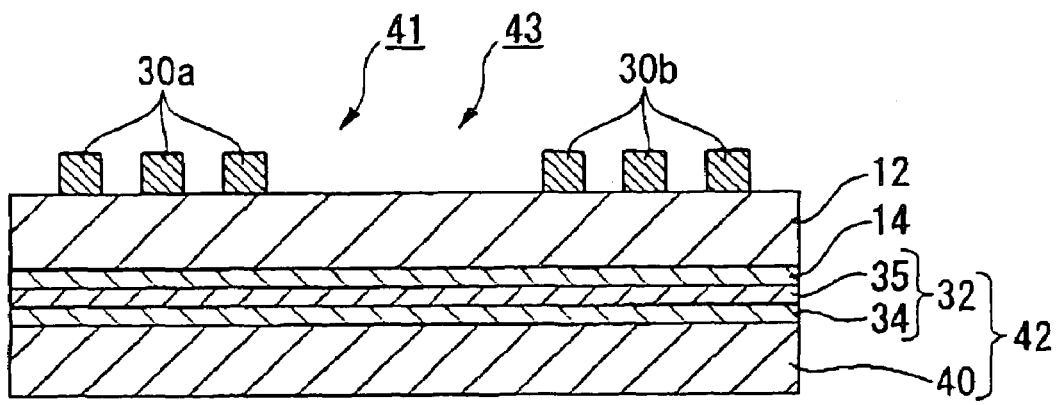
FIG. 12 is a cross-sectional view of the surface acoustic wave element in the third embodiment.

FIG. 12 is a cross-sectional view of the surface acoustic wave element in the third embodiment A pair of IDTs 30a and 30b is formed on the KNbO$_3$ single crystal thin film 41 in the same way as is used for the second embodiment, which leads to manufacturing a surface acoustic wave element 43 shown in FIG. 12. n the surface acoustic wave element 43, the speed of sound was 5000 m/s, which was obtained from a delay time V$_{open}$ of the surface acoustic wave that traveled between the IDT 30a and the IDT 30b. The value of k$^2$ was 35%, which was acquired by a difference between the V$_{open}$ and a delay time V$_{short}$ of the surface acoustic wave that traveled between the IDT 30a and the IDT 30b when a space between the IDT 30a and the IDT 30b is covered with a metallic thin film. This value is higher than that of the surface acoustic wave element 28 obtained in the first embodiment. So long as potassium sodium niobate tantalate is used instead of potassium niobate as the workpiece 17a, a solid solution thin film of K$_{1-x}$Na$_x$Nb$_{1-y}$Ta$_y$O$_3$ ($0 \leq x \leq 1$, $0 \leq y \leq 1$) can be obtained as well.

According to the manufacturing method of the KNbO$_3$ single crystal thin film, a buffer layer 32 is made on a substrate that is made of any one of quartz, crystal, SiO$_2$-covered silicon and diamond-covered silicon, which are inexpensive and suitable for a surface acoustic wave element. Then, a KNbO$_3$ single crystal is precipitated to manufacture a KNbO$_3$ single crystal thin film. Since the KNbO$_3$ single crystal thin film is precipitated in an orthorhombic (001) orientation, an excellent surface acoustic wave element 43 having a maximum value of about 50% for k$^2$ can be manufactured from the KNbO$_3$ single crystal thin film 41.

Figure 13:
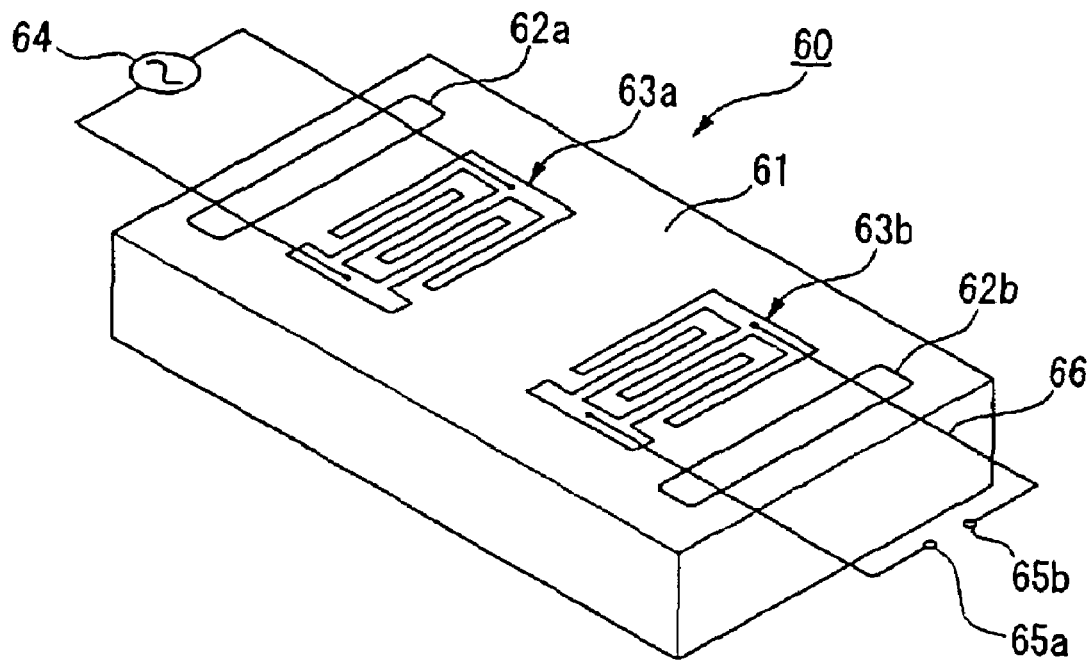
FIG. 13 is a perspective view of a frequency filter of an embodiment in accordance with the invention.

A frequency filter will be explained that includes a surface acoustic wave element in accordance with the invention. FIG. 13 is a perspective view of a frequency filter 60 of one embodiment in accordance with the invention. The frequency filter 60 includes a surface acoustic wave element 61 including one of the KNbO$_3$ single crystal thin films 10, 33, and 41, and a pair of sound absorbing units 62a and 62b absorbing a train of surface acoustic waves that travels on the surface of the surface acoustic wave element 61. A pair of IDT electrodes 63a and 63b is formed on the surface acoustic wave element 61. The IDT electrodes 63a and 63b, formed from an Al or Al alloy, are set to about ¹⁄₁₀₀ in thickness of the pitch of the IDT electrodes. The IDT electrode 63a is connected to a high frequency signal source 64, while the IDT electrode 63b is coupled to signal line 65 including terminals 65a and 65b. The sound absorbing units 62a and 62b are formed so that they may sandwich the IDT electrodes 63a and 63b.

In the frequency filter 60, when a high frequency signal is output from the high frequency signal source 64, the frequency signal is applied to the IDT electrode 63a to generate a surface acoustic wave on the surface of the surface acoustic wave element 61. This surface acoustic wave propagates along the surface of the surface acoustic wave element 61 at a velocity of about 4,000 m/s. Of the surface acoustic wave, the one that has propagated from the IDT electrode 63a towards the sound absorbing unit 62a is absorbed by the sound absorbing unit 62a But among the surface acoustic waves that have propagated towards the IDT 63b, a surface acoustic wave having a particular frequency determined by the pitch of the IDT 63b or having a frequency in a particular band is converted into an electric signal. The rest mostly pass the IDT 63b and are absorbed by the sound absorbing unit 62b.

According to the frequency filter 60, among the electric signals supplied to the IDT 63a, only a surface acoustic wave having a particular frequency or having a frequency in a particular band can be obtained with a high efficiency (filtering).

Figure 14:
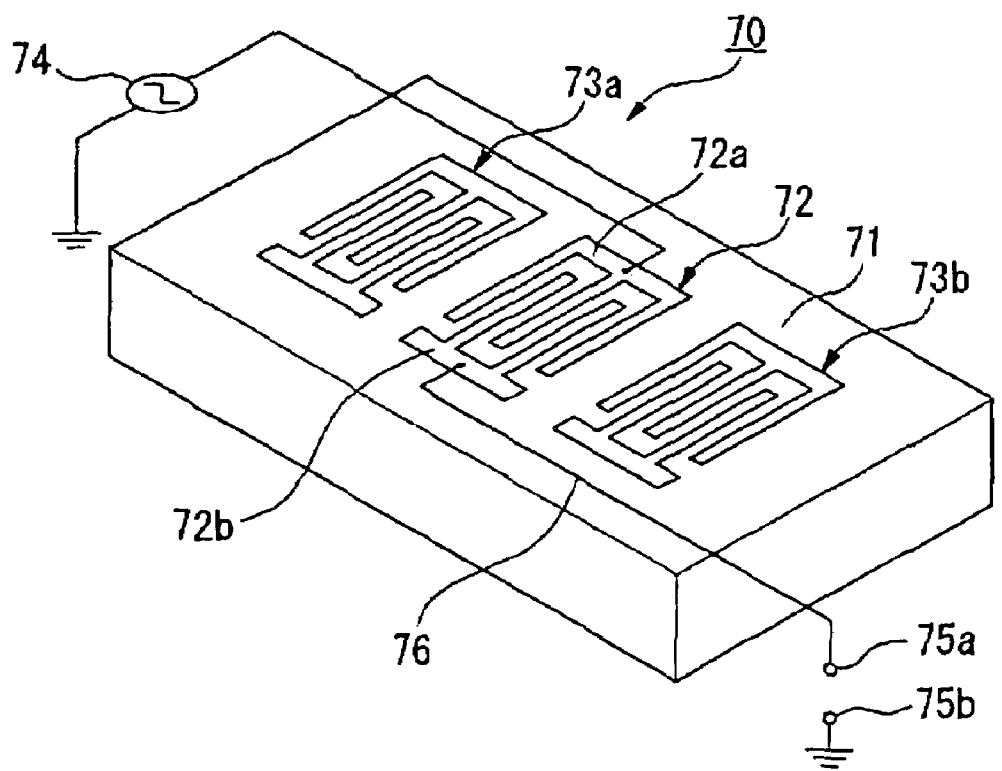
FIG. 14 is a perspective view of a frequency oscillator of an embodiment in accordance with the invention.

FIG. 14 is a perspective view of a frequency oscillator 70 of the embodiment in accordance with the invention. The frequency oscillator 70 includes a surface acoustic wave element 71 including one of the KNbO$_3$ single crystal thin films 10, 33, and 41. An IDT 72 and a pair of IDTs 73a and 73b that sandwiches the IDT 72 are formed on the surface of the surface acoustic wave element 71. The IDT 72 and IDT 73a and 73b, made of an aluminum or aluminum alloy, are set at ¹⁄₁₀₀ in thickness of the IDT pitch. The IDT 72 further contains a pair of comb electrodes 72a and 72b. The electrode 72a is connected to a high frequency signal source 74, while electrode 72b is connected to a signal line 76 having terminals 75a and 75b.

In the frequency oscillator 70, when a high frequency signal is output from the high frequency signal source 74, the frequency signal is applied to the electrode 72a On the surface of the surface acoustic wave element 71, a surface acoustic wave is generated that propagates to the IDT electrode 73a and the IDT electrode 73b, respectively. The velocity of the surface acoustic waves is about 4,000 m/s. Among the surface acoustic waves, a surface acoustic wave having a particular frequency component is reflected at the IDT electrodes 73a and 73b to generate a standing wave between the IDT electrode 73a and the IDT electrode 73b. Of the standing waves, a particular frequency component resonates to increase the amplitude. A part of the surface acoustic wave having this particular frequency component or the frequency component having a particular band is extracted from the comb electrode 72; on the other hand, an electric signal having a frequency dependent on the resonance frequency (or a frequency having a certain band width) of the IDT electrodes 73a and 73b can be extracted at the terminals 75a and 75b.

Figure 15A:
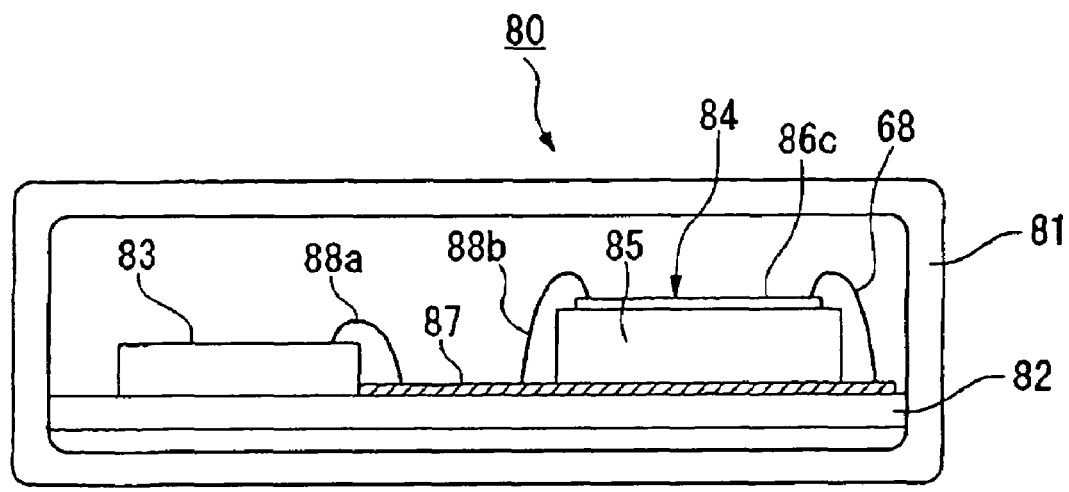
FIGS. 15A and 15B are perspective views of a frequency oscillator of an embodiment in accordance with the invention.
Figure 15B:
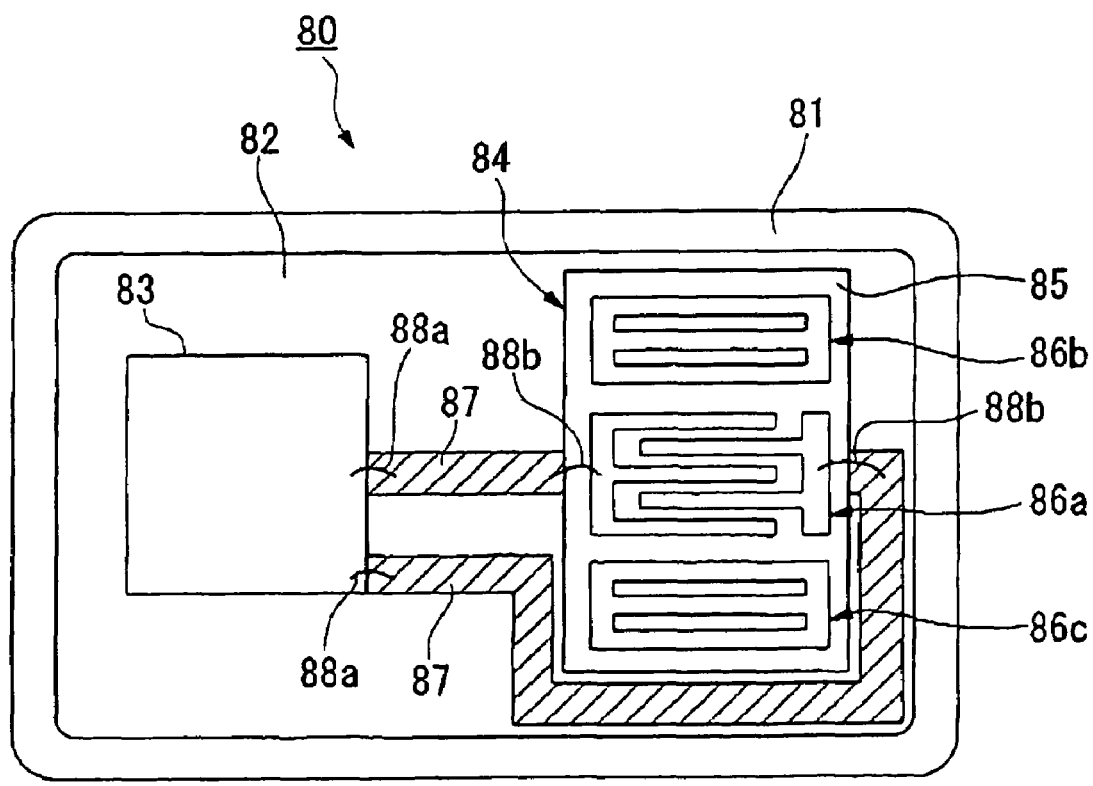

FIGS. 15A and 15B are perspective views of a frequency oscillator of an embodiment in accordance with the invention. FIGS. 15A and 15B show one example in which the frequency oscillator 70 is applied to a VCSO (Voltage Controlled SAW Oscillator) 80. The VCSO 80 has a metal (aluminum and stainless steel) case 81 mounted therein, and the IC (integrated circuit) 83 and the frequency oscillator 84 mounted on the SAW substrate 82. The IC 83 controls the frequency applied to the frequency oscillator 84 in response to a voltage from an external circuit (not shown). The frequency oscillator 84 has a surface acoustic wave element 85, on which IDTs 86a, 86b, and 86c are formed. On the SAW substrate 82, a wire pattern 87 is formed that electrically connects the IC 83 with the frequency oscillator 84. The IC 83 and the wire pattern 87 are electrically connected by wire leads 88a and 88b such as gold leads.

Figure 16:
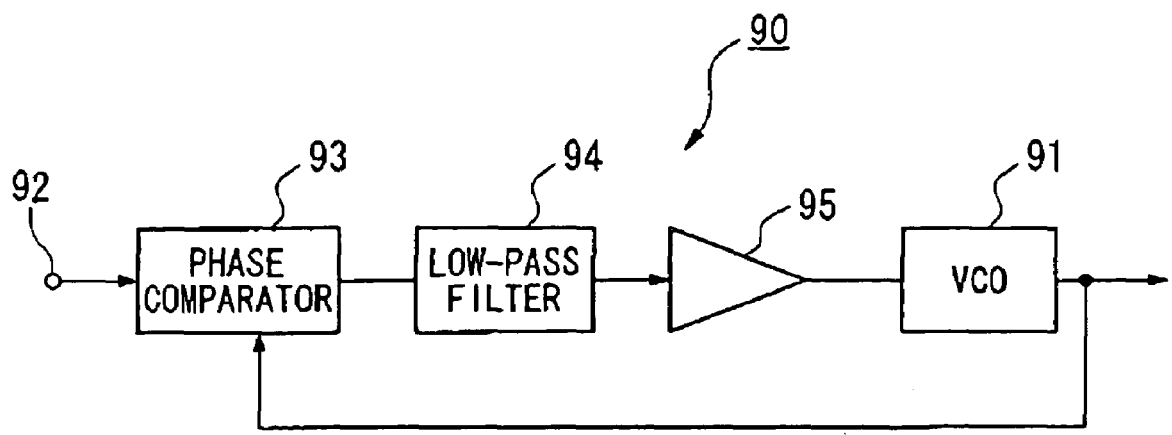
FIG. 16 is a block diagram showing a PLL circuit of an embodiment in accordance with the invention.

FIG. 16 is a block diagram showing a PLL circuit of an embodiment in accordance with the invention. The VCSO 80 is used as a VCO (Voltage Controlled Oscillator) 91 for the PLL circuit 90 shown in FIG. 16. In addition to the VCO 91, the PPL circuit 90 includes an input terminal 92, a phase comparator 93, a low-pass filter 94, and an amplifier 95. The phase comparator 93 compares the phase (or frequency) of a signal input from the input terminal 92 with that of the output signal from the VCO 91, to output an) error voltage signal in response to the difference therebetween. The low-pass filter 94 passes only the low frequency components of the error electric signal from the phase comparator 93. The amplifier 95 amplifies the signal from the low-pass filter 94.

The VCO 91 is an oscillation circuit where the oscillating frequency varies continuously within a range in response to the input applied thereto.

The PPL circuit 90 acts such that the difference between the phase (or frequency) from the input terminal 92 and that from the VCO 91 may be reduced. That is, when the frequency of the signal output from the VCO 91 is synchronized with the frequency of the signal input from the input terminal 92, the VCO 91 subsequently matches the frequency of the signal from the input terminal 92 except for a certain phase difference, thus following a variation of the input signal. Since the frequency oscillator 70 includes any one of the KNbO$_3$ single crystal thin films 10, 33, and 41, it can be small and inexpensive, and in addition produce filter characteristics that can handle a wide range of signals.

Figure 17:
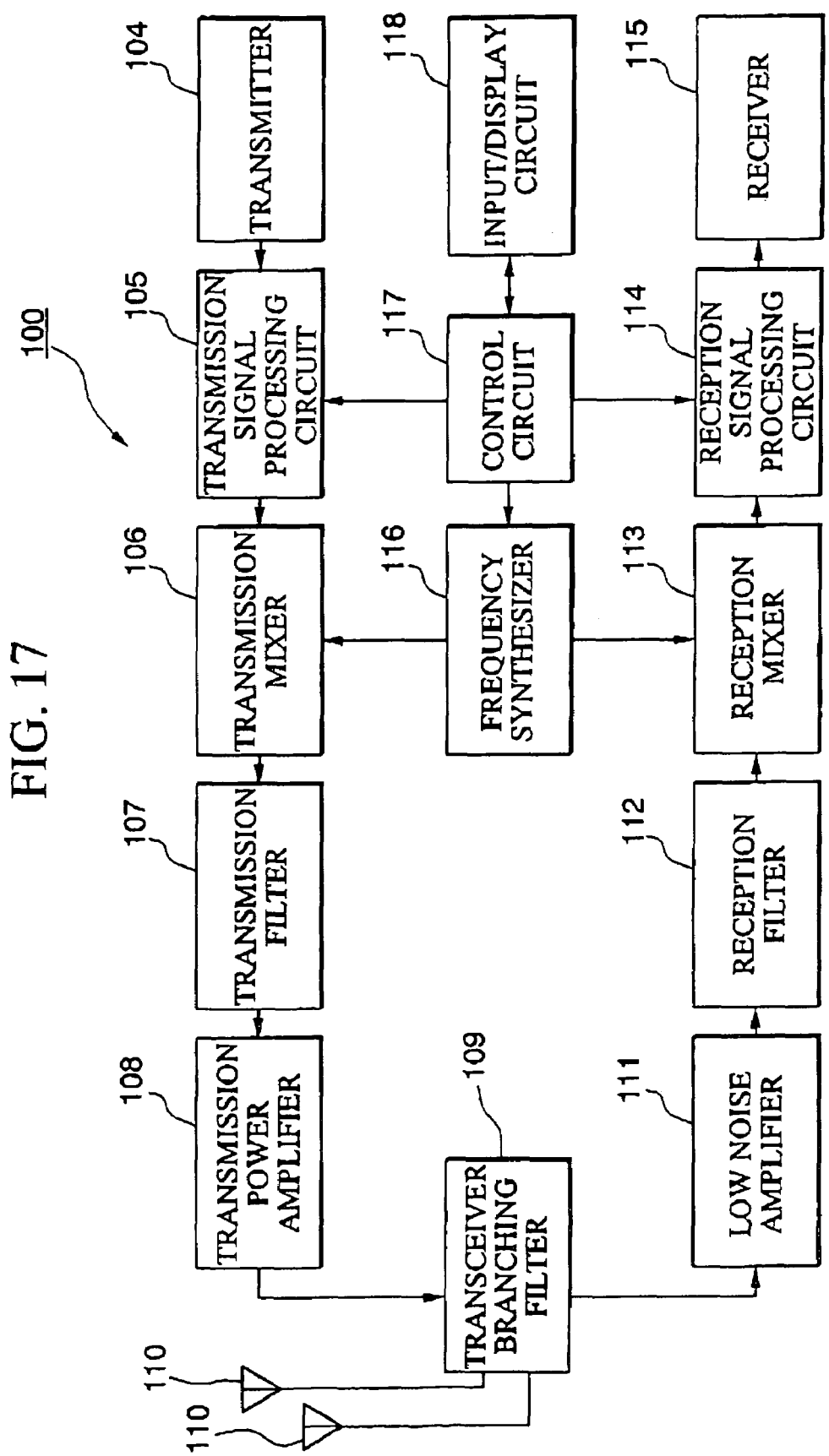
FIG. 17 is a block diagram showing an electronic circuit of an embodiment in accordance with the invention.
Figure 18:
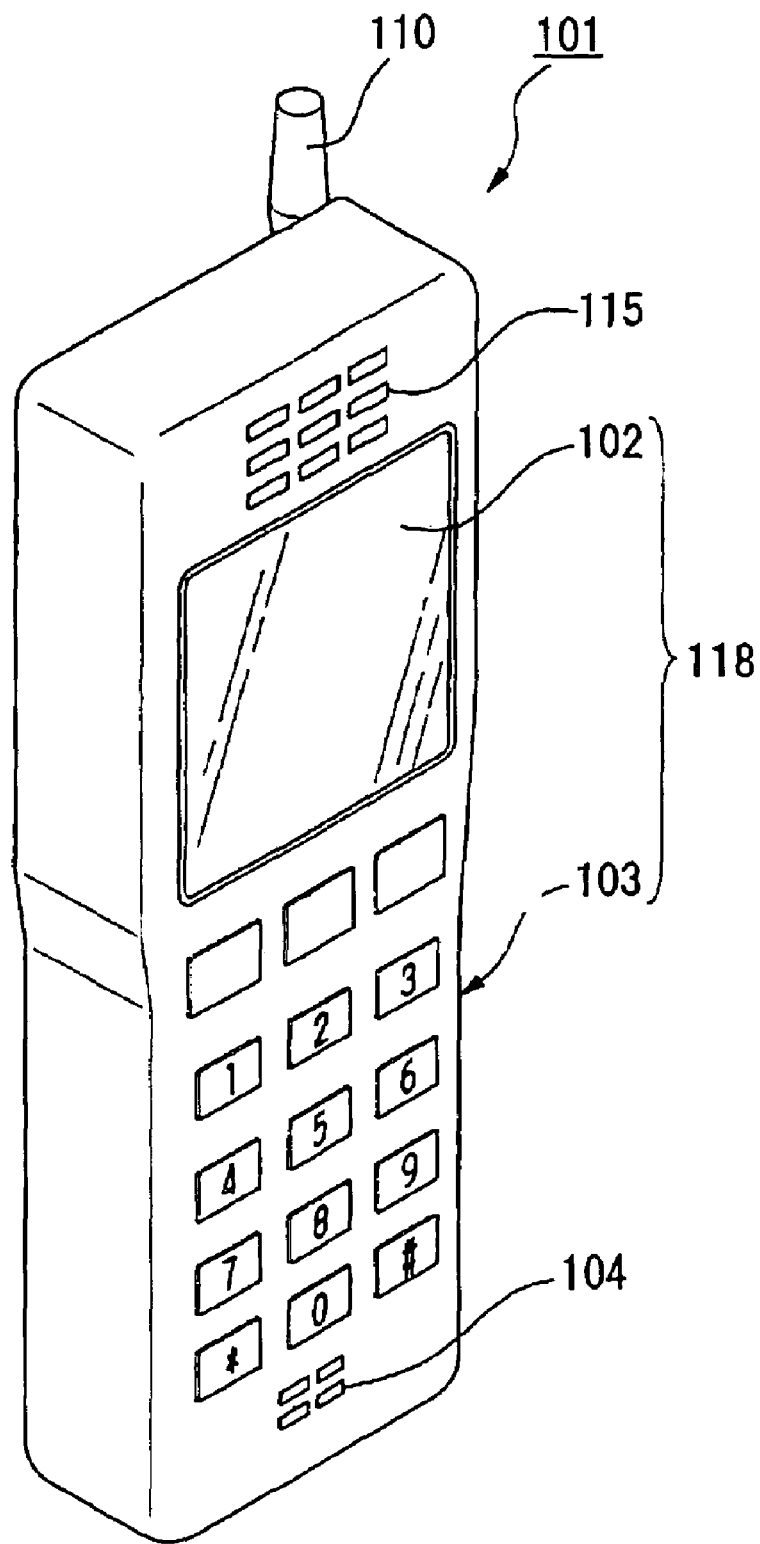
FIG. 18 is a perspective view of a cellular phone of an embodiment in accordance with the invention.
Figure 19:
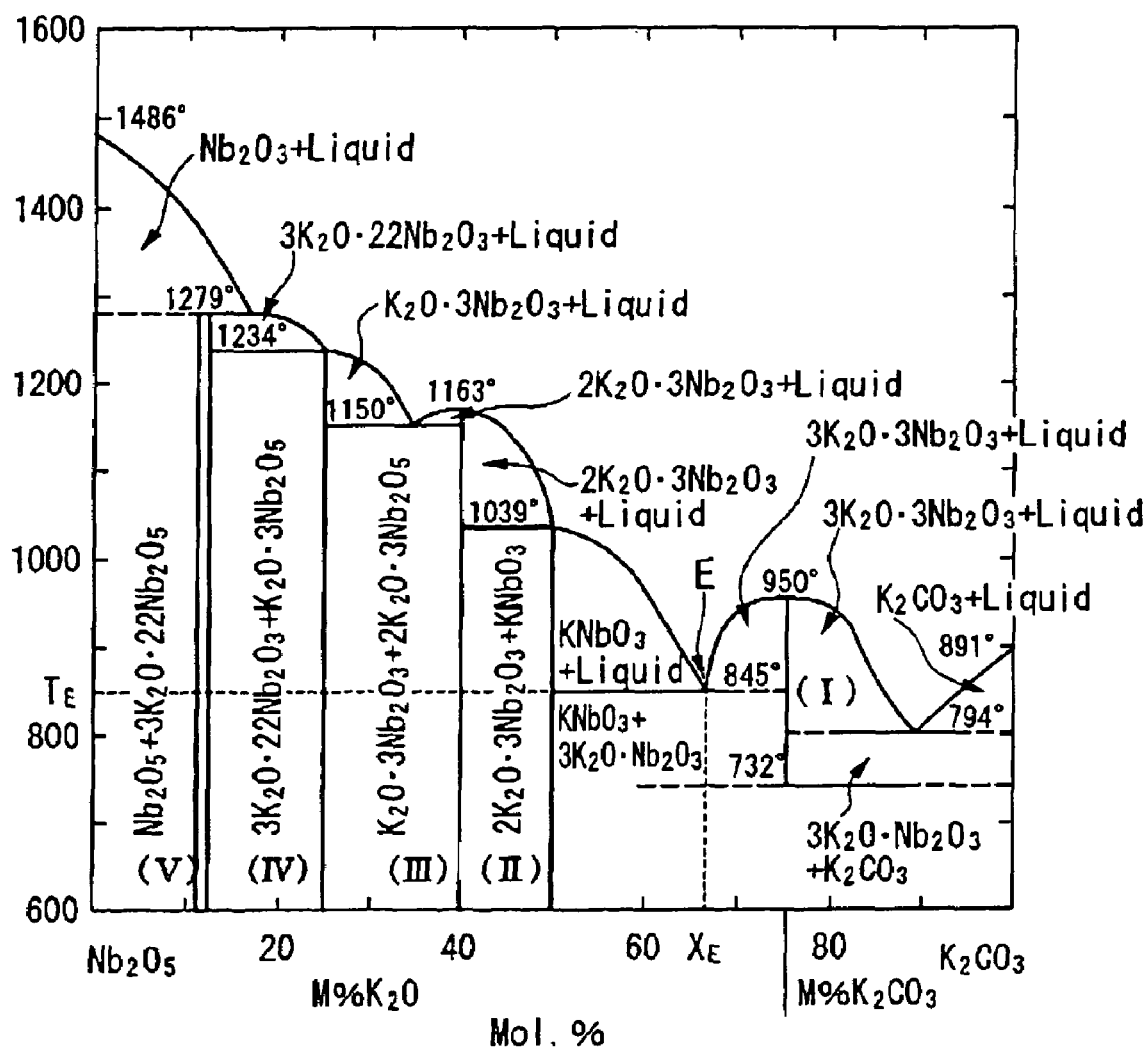
FIG. 19 is a $K_2O$—$Nb_2O_5$ binary phase diagram.
Figure 20:
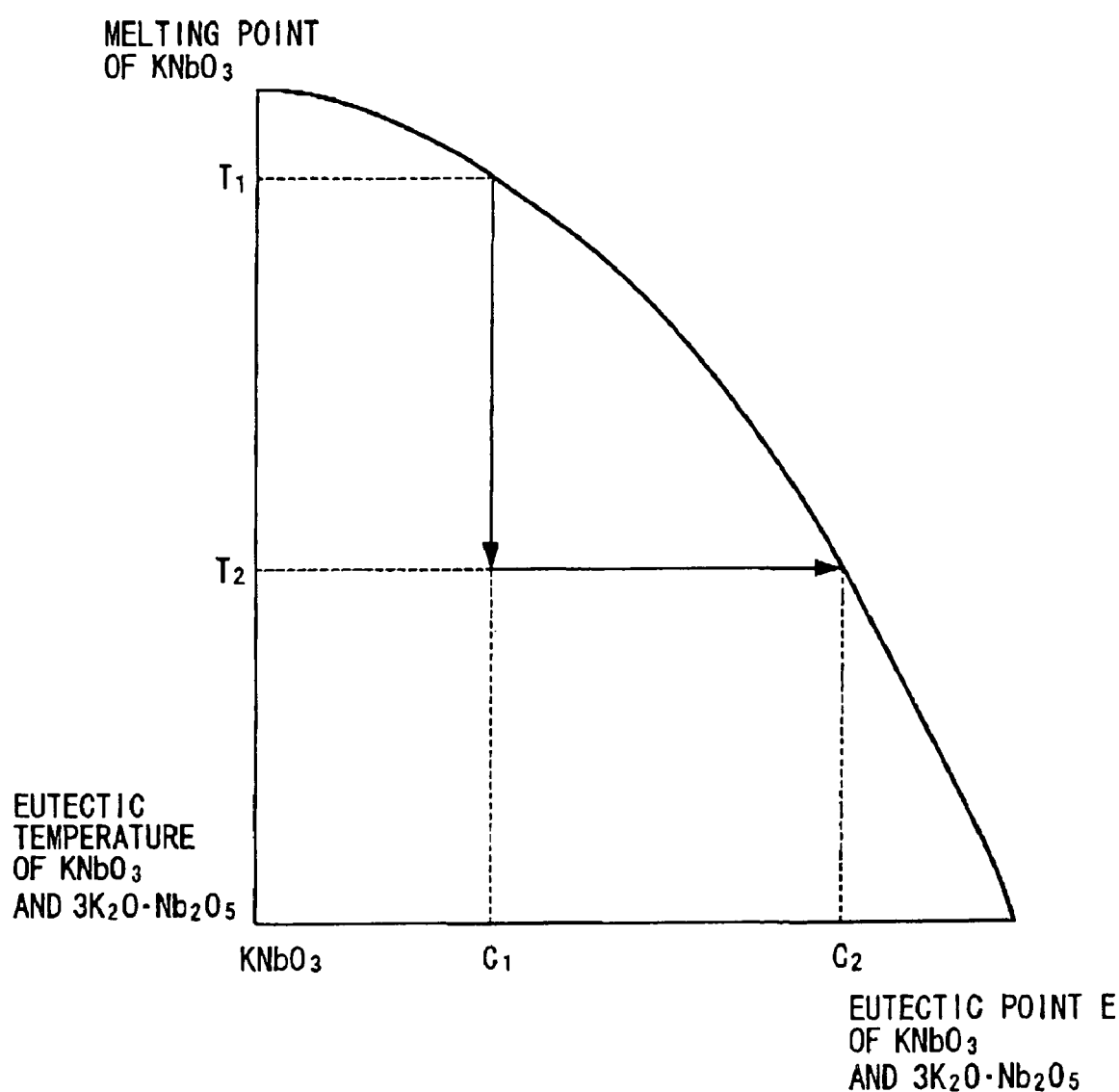
FIG. 20 is a phase diagram showing the relationship between the composition ratio of $KNbO_3$ and the temperature.

FIG. 17 is a block diagram showing an electronic circuit 100 of an embodiment in accordance with the invention. The electronic circuit 100, which includes the frequency filter 60 and the frequency oscillator 70, will be described below. The electronic circuit 100 is mounted in a mobile telephone (electronic device) 101 shown in FIG. 18. The mobile telephone 101 has a liquid crystal display 102 and operation buttons 103. The electronic circuit 100 includes a transmitter 104, a transmission signal processing circuit 105, a transmission mixer 106, a transmission filter 107, a transmission power amplifier 108, a transceiver branching filter 109, antennas 110, a low noise amplifier 111, a reception filter 112, a reception mixer 113, a reception signal processing circuit 114, a receiver 115, a frequency synthesizer 116, a control circuit 117, and an input/display circuit 118.

The transmitter 104 may be a microphone that converts a sound signal to an electric signal. The transmission signal processing circuit 105 performs D/A conversion process and modulation process in response to an electric signal from the transmitter 104. The transmission mixer 106 mixes a signal from the transmission signal processing circuit 105 using a signal from the frequency synthesizer 116. The transmission filter 107, which corresponds to the frequency filter 60 of FIG. 13, may only pass a signal having necessary frequencies out of intermediate frequencies (IF) and cut off other unnecessary frequencies. The signal passed is converted to an RF signal by a conversion circuit (not shown). The transmission power amplifier 108 amplifies the RF signal for outputting to the transceiver branching filter 109. The transceiver branching filter 109 transmits the amplified RF signal through the antenna 110, and receives a signal from the antenna 110 to output to the low noise amplifier 111.

The low noise amplifier 111 amplifies an input signal that is output to a conversion circuit (not shown), where the signal is converted to the IF. The reception filter 112, which corresponds to the frequency filter 60 of FIG. 13, passes only signals having the required frequency among the IF and stops the signals having unnecessary frequencies. The reception mixer 113 mixes the signal from the reception filter 112 using a signal from the frequency synthesizer 116. The reception signal processing circuit 114 performs D/A conversion processing and demodulation processing of the signal from the reception mixer 113. The receiver 115 includes a small speaker that converts an electric signal to a sound signal.

The frequency synthesizer 116, which contains the PLL circuit 90 of FIG. 16, divides the signal from the PLL circuit 90 to generate signals to be supplied to the transmission mixer 106 and the reception mixer 113. The signals are set independently by the transmission filter 107 and the reception filter 112. The input/display circuit 118 is for displaying the state of the mobile telephone 01 to a user, and for inputting the instructions by the user, which corresponds to the liquid crystal display 102 and the operation buttons 103 shown in FIG. 18. The control circuit 117 controls the transmission signal processing circuit 105, the reception signal processing circuit 114, the frequency synthesizer 116, and the input/display circuit 118, thus controlling the entire function of the mobile telephone 101. Since the electronic circuit 100 and the mobile phone 101 include any one of the KNbO$_3$ single crystal thin films 10, 32, and 52, they can be small, wideband, and economical in power consumption.

The scope of the invention is not limited to the embodiments described above, and various modification can be made without departing from the spirit of the invention. For example, the mobile phone 101 is described as an electronic device in the embodiments, and the electronic circuit 100 mounted in the mobile phone 101 is explained as an electronic circuit. However, the invention is not limited to the mobile phone, and can be applied to any mobile communication apparatus and electronic circuits mounted therein.

The invention can be applied not only to mobile telecommunication devices, but to communication devices that are used in a stationary state such as a tuner for receiving BS (Broadcast Satellite) or CS (Commercial Satellite) broadcast and electronic circuits provided therein. In addition, besides a communication device that uses electric waves propagating in the air as a communication carrier, the present invention can also be applied to an electronic device such as a HUB that uses a high frequency signal propagated in a coaxial cable or a light signal propagated in an optical cable, and electronic circuits provided therein.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing potassium niobate single crystal thin film by vapor deposition, comprising the steps of:

supplying a material in a gas phase to a substrate so that a value of x is in a range $0.5 \leq x \leq x_E$ immediately after deposition of the material on the substrate, where the $x_E$ is a mole composition ratio at a eutectic point E for KNbO$_3$ and 3K$_2$O.Nb$_2$O$_5$ under a predetermined oxygen partial pressure, and the x is a mole ratio of niobium (Nb) to potassium (K) in K$_x$Nb$_{1-x}$O$_y$;

precipitating potassium niobate single crystal while maintaining a temperature $T_s$ of the substrate in a range $T_E \leq T_s \leq T_m$, where $T_E$ is a temperature at the eutectic point, and $T_m$ is a complete melting temperature at the oxygen partial pressure and at the value of x in the range; and evaporating a liquid phase portion from the K$_x$Nb$_{1-x}$O$_y$, where a solid phase portion and a liquid phase portion coexist.

2. The method as defined in claim 1, wherein the steps of evaporating and precipitating are repeated to continuously grow the potassium niobate single crystal thin film.

3. The method as defined in claim 1, wherein the substrate includes an axis on a surface thereof that is oriented in a vertical direction and in an in-plane direction to the surface, and the single crystal is grown epitaxially on the substrate.

4. The method as defined in claim 3, wherein the substrate has a larger coefficient of thermal expansion than that of potassium niobate, and has a perovskite-type pseudo-cubic unit cell that is oriented in an in-plane (100) direction on an entire surface of the substrate.

5. The method as defined in claim 4, wherein the substrate is a strontium titanate (100) single crystal substrate.

6. The method as defined in claim 3, wherein the substrate has a smaller coefficient of thermal expansion than that of potassium niobate, and has a perovskite-type pseudo-cubic unit cell that is oriented in an in-plane (100) direction on an entire surface of the substrate.

7. The method as defined in claim 6, wherein the substrate includes a silicon single crystal substrate and a buffer layer grown epitaxially thereon.

8. The method as defined in claim 7, wherein the buffer layer includes a first buffer layer of a NaCl-type oxide and a second buffer layer of a simple perovskite-type oxide grown epitaxially thereon.

9. The method as defined in claim 7, wherein the buffer layer includes a first buffer layer of a fluorite-type oxide, and a second buffer layer of a laminated perovskite-type oxide grown epitaxially on the first buffer layer and a simple perovskite-type oxide grown epitaxially on the laminated perovskite-type oxide.

10. The method as defined in claim 6, wherein the substrate includes a body that is composed of one of quartz, crystal, $SiO_2$-covered silicon, and diamond-covered silicon, and a buffer layer formed thereon, and wherein the buffer layer contains a first buffer layer grown in an in-plane orientation independently of crystal orientation of the substrate and a second buffer layer of an oxide grown epitaxially on the first buffer layer, the first and second buffer layers being manufactured by a vapor deposition method accompanying ion beam radiation.

11. The method as defined in claim 10, wherein the first buffer layer is composed of a NaCl-type oxide and the second buffer layer is composed of a simple perovskite-type oxide.

12. The method as defined in claim 10, wherein the first buffer layer is composed of a fluorite-type oxide, and the second buffer layer is composed of a laminated perovskite-type oxide and a simple perovskite-type oxide grown epitaxially on the laminated perovskite-type oxide.

13. A surface acoustic wave element comprising a potassium niobate single crystal thin film produced by the manufacturing method as defined in claim 1.

14. A frequency filter comprising a surface acoustic wave element as defined in claim 13.

15. A frequency oscillator comprising a surface acoustic wave element as defined in claim 13.

16. An electronic circuit comprising a frequency oscillator as defined in claim 15.

17. An electronic apparatus comprising at least one of a frequency filter as defined in claim 14, a frequency oscillator as defined in claim 15, and an electronic circuit as defined in claim 16.

* * * * *